United States Patent
Aoki et al.

(10) Patent No.: US 7,980,003 B2
(45) Date of Patent: Jul. 19, 2011

(54) HEAT PROCESSING APPARATUS AND HEAT PROCESSING METHOD

(75) Inventors: Shigeki Aoki, Koshi (JP); Yuichi Sakai, Koshi (JP); Mitsuo Yamashita, Koshi (JP); Hiroshi Shinya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1218 days.

(21) Appl. No.: 11/624,404

(22) Filed: Jan. 18, 2007

(65) Prior Publication Data

US 2007/0169373 A1    Jul. 26, 2007

(30) Foreign Application Priority Data

Jan. 25, 2006 (JP) ................................. 2006-015926

(51) Int. Cl.
*F26B 3/001* (2006.01)

(52) U.S. Cl. ............. 34/549; 34/443; 34/487; 438/584; 427/235.8

(58) Field of Classification Search .................... 34/549, 34/443, 487; 438/584; 427/235.8
See application file for complete search history.

(56) References Cited

U.S. PATENT DOCUMENTS

| | | | | |
|---|---|---|---|---|
| 3,491,457 A | * | 1/1970 | Hankin et al. | 34/265 |
| 3,918,168 A | * | 11/1975 | Saeman | 34/377 |
| 3,919,968 A | * | 11/1975 | Sandmann et al. | 118/663 |
| 4,022,580 A | * | 5/1977 | Rush | 422/211 |
| 4,143,468 A | * | 3/1979 | Novotny et al. | 34/276 |
| 4,327,665 A | * | 5/1982 | Arrasmith | 118/666 |
| 4,416,624 A | * | 11/1983 | Bloom | 432/134 |
| 4,455,762 A | * | 6/1984 | Saeman | 34/170 |
| 4,458,428 A | * | 7/1984 | Saeman | 34/506 |
| 4,640,726 A | * | 2/1987 | Sallee et al. | 156/85 |
| 4,728,531 A | * | 3/1988 | Matz et al. | 427/541 |
| 4,754,769 A | * | 7/1988 | Flynn | 132/73.5 |
| 4,785,552 A | * | 11/1988 | Best | 34/418 |
| 4,922,277 A | * | 5/1990 | Carlson et al. | 396/609 |
| 4,957,432 A | * | 9/1990 | Rachal et al. | 432/59 |
| 5,010,659 A | * | 4/1991 | Treleven | 34/269 |
| 5,083,381 A | * | 1/1992 | Aigo | 34/317 |
| 5,090,134 A | * | 2/1992 | Russemeyer et al. | 34/589 |
| 5,090,898 A | * | 2/1992 | Smith | 431/326 |
| 5,099,586 A | * | 3/1992 | Anderson | 34/68 |
| 5,105,557 A | * | 4/1992 | Vadasz et al. | 34/401 |
| 5,119,570 A | * | 6/1992 | Russemeyer et al. | 34/363 |
| 5,147,690 A | * | 9/1992 | Faust et al. | 427/372.2 |
| 5,174,045 A | * | 12/1992 | Thompson et al. | 34/58 |
| 5,177,878 A | * | 1/1993 | Visser | 34/92 |
| 5,205,051 A | * | 4/1993 | Hurwitt | 34/403 |

(Continued)

FOREIGN PATENT DOCUMENTS

JP    58110034 A    *  6/1983

(Continued)

*Primary Examiner* — Stephen M. Gravini
(74) *Attorney, Agent, or Firm* — Oblon, Spivak, McClelland, Maier & Neustadt, L.L.P.

(57) ABSTRACT

A heat processing apparatus includes a heating plate configured to heat the substrate; a cover configured to surround a space above the heating plate; an exhaust gas flow forming mechanism configured to exhaust gas inside the cover to form exhaust gas flows within the space above the heating plate; a downflow forming mechanism configured to form downflows uniformly supplied onto an upper surface of the substrate placed on the heating plate; and a control mechanism configured to execute mode switching control between a mode arranged to heat the substrate while forming the downflows by the downflow forming mechanism and a mode arranged to heat the substrate while forming the exhaust gas flows by the exhaust gas flow forming mechanism.

9 Claims, 15 Drawing Sheets

U.S. PATENT DOCUMENTS

| | | | | |
|---|---|---|---|---|
| 5,210,959 A * | 5/1993 | Brestovansky et al. | | 34/629 |
| 5,216,820 A * | 6/1993 | Green et al. | | 34/273 |
| 5,228,206 A * | 7/1993 | Grant et al. | | 34/275 |
| 5,237,756 A * | 8/1993 | Hurwitt | | 34/406 |
| 5,290,381 A * | 3/1994 | Nozawa et al. | | 156/345.27 |
| 5,307,568 A * | 5/1994 | Matsuo et al. | | 34/92 |
| 5,314,574 A * | 5/1994 | Takahashi | | 438/706 |
| 5,377,708 A * | 1/1995 | Bergman et al. | | 134/105 |
| 5,401,316 A * | 3/1995 | Shiraishi et al. | | 118/689 |
| 5,451,524 A * | 9/1995 | Coble et al. | | 435/284.1 |
| 5,489,337 A * | 2/1996 | Nomura et al. | | 118/677 |
| 5,551,165 A * | 9/1996 | Turner et al. | | 34/404 |
| 5,575,079 A * | 11/1996 | Yokomizo et al. | | 34/78 |
| 5,621,982 A * | 4/1997 | Yamashita et al. | | 34/203 |
| 5,671,544 A * | 9/1997 | Yokomizo et al. | | 34/78 |
| 5,715,612 A * | 2/1998 | Schwenkler | | 34/470 |
| 5,727,332 A * | 3/1998 | Thrasher et al. | | 34/277 |
| 5,735,194 A * | 4/1998 | Cochran | | 99/483 |
| 5,746,008 A * | 5/1998 | Yamashita et al. | | 34/211 |
| 5,749,159 A * | 5/1998 | Schwenkler | | 34/426 |
| 5,752,532 A * | 5/1998 | Schwenkler | | 134/102.3 |
| 5,821,035 A * | 10/1998 | Hirano et al. | | 430/311 |
| 5,879,459 A * | 3/1999 | Gadgil et al. | | 118/715 |
| 5,884,412 A * | 3/1999 | Tietz et al. | | 34/58 |
| 5,886,326 A * | 3/1999 | Tang | | 219/679 |
| 5,899,001 A * | 5/1999 | Layton | | 34/77 |
| 5,901,462 A * | 5/1999 | Rudd | | 34/274 |
| 5,903,711 A * | 5/1999 | Okase | | 392/418 |
| 5,908,292 A * | 6/1999 | Smith et al. | | 432/197 |
| 5,913,981 A * | 6/1999 | Florez | | 134/3 |
| 5,940,985 A * | 8/1999 | Kamikawa et al. | | 34/471 |
| 5,942,035 A * | 8/1999 | Hasebe et al. | | 118/52 |
| 5,943,880 A * | 8/1999 | Tateyama | | 62/434 |
| 5,956,859 A * | 9/1999 | Matsumoto et al. | | 34/74 |
| 5,960,555 A * | 10/1999 | Deaton et al. | | 34/58 |
| 5,962,070 A * | 10/1999 | Mitsuhashi et al. | | 427/240 |
| 5,985,041 A * | 11/1999 | Florez | | 134/2 |
| 6,029,371 A * | 2/2000 | Kamikawa et al. | | 34/516 |
| 6,067,728 A * | 5/2000 | Farmer et al. | | 34/470 |
| 6,072,162 A * | 6/2000 | Ito et al. | | 219/444.1 |
| 6,085,437 A * | 7/2000 | Stipp | | 34/115 |
| 6,095,167 A * | 8/2000 | Florez | | 134/183 |
| 6,122,837 A * | 9/2000 | Olesen et al. | | 34/315 |
| 6,129,044 A * | 10/2000 | Zhao et al. | | 118/715 |
| 6,156,151 A * | 12/2000 | Komino et al. | | 156/345.29 |
| 6,165,277 A * | 12/2000 | Florez | | 134/2 |
| 6,172,337 B1 * | 1/2001 | Johnsgard et al. | | 219/390 |
| 6,183,563 B1 * | 2/2001 | Choi et al. | | 118/715 |
| 6,192,603 B1 * | 2/2001 | Seita | | 34/559 |
| 6,212,789 B1 * | 4/2001 | Kato et al. | | 34/77 |
| 6,216,364 B1 * | 4/2001 | Tanaka et al. | | 34/448 |
| 6,241,403 B1 | 6/2001 | Sakamoto et al. | | |
| 6,256,903 B1 * | 7/2001 | Rudd | | 34/412 |
| 6,261,007 B1 * | 7/2001 | Takamori et al. | | 396/611 |
| 6,263,590 B1 * | 7/2001 | Whigham et al. | | 34/426 |
| 6,286,524 B1 * | 9/2001 | Okuchi et al. | | 134/95.2 |
| 6,308,436 B1 * | 10/2001 | Stipp | | 34/422 |
| 6,319,322 B1 * | 11/2001 | Ueda et al. | | 118/666 |
| 6,342,691 B1 * | 1/2002 | Johnsgard et al. | | 219/390 |
| 6,354,832 B1 * | 3/2002 | Yoshimura et al. | | 432/247 |
| 6,363,624 B1 * | 4/2002 | Pang et al. | | 34/85 |
| 6,370,796 B1 * | 4/2002 | Zucker | | 34/428 |
| 6,393,719 B1 * | 5/2002 | Stipp | | 34/115 |
| 6,399,923 B2 * | 6/2002 | Kano et al. | | 219/411 |
| 6,402,844 B1 | 6/2002 | Harada et al. | | |
| 6,412,501 B1 * | 7/2002 | Onoda et al. | | 134/95.2 |
| 6,425,191 B1 * | 7/2002 | Kao et al. | | 34/443 |
| 6,443,641 B2 * | 9/2002 | Takamori et al. | | 396/579 |
| 6,446,355 B1 * | 9/2002 | Jones et al. | | 34/245 |
| 6,458,208 B1 * | 10/2002 | Anai et al. | | 118/52 |
| 6,553,689 B2 * | 4/2003 | Jain et al. | | 34/444 |
| 6,564,474 B2 * | 5/2003 | Nagashima | | 34/638 |
| 6,579,373 B2 | 6/2003 | Moriyama | | |
| 6,607,785 B2 * | 8/2003 | Timmons et al. | | 427/248.1 |
| 6,615,510 B2 * | 9/2003 | Jones et al. | | 34/448 |
| 6,634,805 B1 * | 10/2003 | Templeton et al. | | 396/571 |
| 6,647,642 B2 * | 11/2003 | Kamikawa et al. | | 34/490 |
| 6,651,357 B2 * | 11/2003 | Bria et al. | | 34/427 |
| 6,655,042 B2 * | 12/2003 | Yi et al. | | 34/340 |
| 6,658,764 B2 * | 12/2003 | Hsu | | 34/468 |
| 6,665,952 B2 * | 12/2003 | Nagashima | | 34/391 |
| 6,681,497 B2 * | 1/2004 | Bria et al. | | 34/79 |
| 6,688,020 B2 * | 2/2004 | Toshima et al. | | 34/573 |
| 6,688,784 B1 * | 2/2004 | Templeton | | 396/611 |
| 6,709,523 B1 * | 3/2004 | Toshima et al. | | 118/725 |
| 6,713,405 B2 * | 3/2004 | Moriyama | | 438/758 |
| 6,725,565 B2 * | 4/2004 | Harano et al. | | 34/266 |
| 6,729,041 B2 * | 5/2004 | Shindo et al. | | 34/444 |
| 6,749,655 B2 * | 6/2004 | Dautenhahn | | 55/385.1 |
| 6,796,054 B2 * | 9/2004 | Minami et al. | | 34/443 |
| 6,830,389 B2 * | 12/2004 | Templeton | | 396/611 |
| 6,838,643 B2 * | 1/2005 | Kobayashi et al. | | 219/390 |
| 6,848,198 B2 * | 2/2005 | Yamaguchi | | 34/619 |
| 6,867,153 B2 * | 3/2005 | Tokunaga | | 438/800 |
| 6,872,670 B2 * | 3/2005 | Toshima et al. | | 438/765 |
| 6,877,247 B1 * | 4/2005 | DeMoore | | 34/269 |
| 6,920,704 B1 * | 7/2005 | Silverbrook et al. | | 34/422 |
| 6,944,970 B2 * | 9/2005 | Silverbrook et al. | | 34/621 |
| 6,959,502 B2 * | 11/2005 | Nakamura et al. | | 34/233 |
| 6,966,949 B2 * | 11/2005 | Kobayashi et al. | | 118/663 |
| 6,986,214 B2 * | 1/2006 | Minami et al. | | 34/443 |
| 7,024,798 B2 * | 4/2006 | Minami et al. | | 34/443 |
| 7,107,701 B2 * | 9/2006 | Takemura et al. | | 34/526 |
| 7,146,744 B2 * | 12/2006 | Kobayashi | | 34/62 |
| 7,268,323 B2 * | 9/2007 | Tomobe et al. | | 219/494 |
| 7,343,698 B2 * | 3/2008 | Sugimoto et al. | | 34/406 |
| 7,353,623 B2 * | 4/2008 | Asuke | | 34/381 |
| 7,357,842 B2 * | 4/2008 | Ishikawa et al. | | 118/503 |
| 7,367,138 B2 * | 5/2008 | Sogard | | 34/275 |
| 7,377,053 B1 * | 5/2008 | Maeda et al. | | 34/445 |
| 7,437,834 B2 * | 10/2008 | Nakatsukasa et al. | | 34/381 |
| 7,493,705 B2 * | 2/2009 | Gomi | | 34/78 |
| 7,513,063 B2 * | 4/2009 | Sago et al. | | 34/578 |
| 7,526,879 B2 * | 5/2009 | Bae et al. | | 34/596 |
| 7,644,512 B1 * | 1/2010 | Liu et al. | | 34/413 |
| 7,651,306 B2 * | 1/2010 | Rice et al. | | 414/217 |
| 7,665,227 B2 * | 2/2010 | Wright et al. | | 34/339 |
| 7,669,530 B2 * | 3/2010 | Aylor et al. | | 101/424.1 |
| 7,694,647 B2 * | 4/2010 | Ishikawa et al. | | 118/503 |
| 7,699,021 B2 * | 4/2010 | Volfovski et al. | | 118/500 |
| 7,743,728 B2 * | 6/2010 | Ishikawa et al. | | 118/503 |
| 7,745,079 B2 * | 6/2010 | Coon | | 430/30 |
| 7,797,855 B2 * | 9/2010 | Fukuoka et al. | | 34/78 |
| 7,798,764 B2 * | 9/2010 | Rice et al. | | 414/805 |
| 7,875,864 B2 * | 1/2011 | Sogard | | 250/492.2 |
| 2001/0025431 A1 * | 10/2001 | Kitano et al. | | 34/406 |
| 2001/0032396 A1 * | 10/2001 | Toshima et al. | | 34/444 |
| 2002/0004994 A1 * | 1/2002 | Rudd | | 34/343 |
| 2002/0073576 A1 * | 6/2002 | Kamikawa et al. | | 34/448 |
| 2002/0092198 A1 * | 7/2002 | Bria et al. | | 34/444 |
| 2002/0095818 A1 * | 7/2002 | Jain et al. | | 34/448 |
| 2003/0000102 A1 * | 1/2003 | Jones et al. | | 34/549 |
| 2003/0015218 A1 * | 1/2003 | Bran | | 134/1.3 |
| 2003/0106239 A1 * | 6/2003 | Yi et al. | | 34/444 |
| 2003/0115770 A1 * | 6/2003 | Harano et al. | | 34/266 |
| 2003/0159307 A1 * | 8/2003 | Sago et al. | | 34/107 |
| 2003/0172542 A1 * | 9/2003 | Minami et al. | | 34/92 |
| 2003/0208922 A1 * | 11/2003 | Hsu | | 34/468 |
| 2003/0230003 A1 * | 12/2003 | Miller et al. | | 34/444 |
| 2004/0123490 A1 * | 7/2004 | Pancheri et al. | | 34/597 |
| 2004/0139626 A1 * | 7/2004 | Takemura et al. | | 34/448 |
| 2004/0187344 A1 * | 9/2004 | Yamaguchi | | 34/619 |
| 2004/0194340 A1 * | 10/2004 | Kobayashi | | 34/630 |
| 2004/0216324 A1 * | 11/2004 | Nakamura et al. | | 34/235 |
| 2004/0216325 A1 * | 11/2004 | Minami et al. | | 34/549 |
| 2005/0155248 A1 * | 7/2005 | Silverbrook et al. | | 34/422 |
| 2005/0155252 A1 * | 7/2005 | Silverbrook et al. | | 34/621 |
| 2005/0160619 A1 * | 7/2005 | Minami et al. | | 34/406 |
| 2005/0198857 A1 * | 9/2005 | Nakazawa et al. | | 34/391 |
| 2005/0229427 A1 * | 10/2005 | Sugimoto et al. | | 34/406 |
| 2006/0032072 A1 * | 2/2006 | Yamaga et al. | | 34/72 |
| 2006/0059708 A1 * | 3/2006 | Kim et al. | | 34/351 |
| 2006/0137213 A1 * | 6/2006 | Asuke | | 34/402 |
| 2006/0168839 A1 * | 8/2006 | Lee et al. | | 34/92 |
| 2006/0179680 A1 * | 8/2006 | Miller et al. | | 34/444 |
| 2006/0191160 A1 * | 8/2006 | Miller et al. | | 34/444 |
| 2006/0236559 A1 * | 10/2006 | Mori | | 34/380 |

| | | | | | | | |
|---|---|---|---|---|---|---|---|
| 2006/0292311 | A1* | 12/2006 | Kilburn et al. ............... 427/487 | JP | 63067729 A | * 3/1988 | |
| 2007/0022626 | A1* | 2/2007 | Gomi ........................... 34/329 | JP | 02003910 A | * 1/1990 | |
| 2007/0079525 | A1* | 4/2007 | Sogard ......................... 34/275 | JP | 02187015 A | * 7/1990 | |
| 2007/0101602 | A1* | 5/2007 | Bae et al. ....................... 34/77 | JP | 03127820 A | * 5/1991 | |
| 2007/0169373 | A1* | 7/2007 | Aoki et al. .................... 34/549 | JP | 03171616 A | * 7/1991 | |
| 2007/0175062 | A1* | 8/2007 | Toshima et al. ............... 34/410 | JP | 03214619 A | * 9/1991 | |
| 2007/0209226 | A1* | 9/2007 | Coon ............................ 34/403 | JP | 04033329 A | * 2/1992 | |
| 2007/0227034 | A1* | 10/2007 | Ogawa et al. ................. 34/444 | JP | 07201843 A | * 8/1995 | |
| 2008/0016714 | A1* | 1/2008 | Kaneyama et al. ........... 34/317 | JP | 10012517 A | * 1/1998 | |
| 2008/0104861 | A1* | 5/2008 | Yahiro .......................... 34/463 | JP | 10012536 A | * 1/1998 | |
| 2008/0172903 | A1* | 7/2008 | Shimoda et al. .............. 34/423 | JP | 10146274 A | * 6/1998 | |
| 2008/0184584 | A1* | 8/2008 | Sogard ......................... 34/275 | JP | 11214317 A | * 8/1999 | |
| 2008/0192214 | A1* | 8/2008 | Leenders et al. ............... 355/30 | JP | 2000031017 A | * 1/2000 | |
| 2008/0295872 | A1* | 12/2008 | Riker et al. ................... 134/105 | JP | 2000091185 A | * 3/2000 | |
| 2009/0019722 | A1* | 1/2009 | Nakazawa et al. ............ 34/391 | JP | 2000181080 A | * 6/2000 | |
| 2009/0056161 | A1* | 3/2009 | Ahn et al. ....................... 34/79 | JP | 2001185471 A | * 7/2001 | |
| 2009/0158613 | A1* | 6/2009 | Aihara ........................... 34/341 | JP | 2001189250 A | * 7/2001 | |
| 2010/0223805 | A1* | 9/2010 | Hyakutake et al. ............ 34/427 | JP | 2003-318091 | 11/2003 | |
| 2010/0229416 | A1* | 9/2010 | Aburatani et al. ............. 34/194 | JP | 2003318091 A | * 11/2003 | |
| 2010/0293806 | A1* | 11/2010 | Liu et al. ....................... 34/239 | JP | 2006060228 A | * 3/2006 | |
| 2010/0319213 | A1* | 12/2010 | Kim et al. ..................... 34/565 | JP | 2007201037 A | * 8/2007 | |
| | | | | JP | 2008016764 A | * 1/2008 | |
| | | FOREIGN PATENT DOCUMENTS | | JP | 2008177494 A | * 7/2008 | |
| JP | | 58212126 A | * 12/1983 | JP | 2009004404 A | * 1/2009 | |
| JP | | 59104117 A | * 6/1984 | JP | 2009111343 A | * 5/2009 | |
| JP | | 60167416 A | * 8/1985 | | | | |
| JP | | 61287220 A | * 12/1986 | * cited by examiner | | | |

HEAT PROCESSING APPARATUS AND HEAT PROCESSING METHOD

BACKGROUND OF THE INVENTION

1. Field of the Invention

The present invention relates to a heat processing apparatus and heat processing method for heating a substrate, which are used for manufacturing semiconductor devices while performing a coating/developing process on a substrate, such as a semiconductor wafer.

2. Description of the Related Art

In a photolithography step for semiconductor devices, a resist is applied onto a semiconductor wafer (which will be simply referred to as "wafer" hereinafter) to form a resist film. Then, the resist film is subjected to a light exposure process in accordance with a predetermined circuit pattern. Then, the light-exposed pattern thus formed is subjected to a developing process to form a circuit pattern on the resist film.

In a photolithography step of this type, various heat processes are performed, such as a heat process (pre-baking) performed subsequently to coating of a resist or a chemical solution for, e.g., a BARC, a heat process (post exposure baking) performed subsequently to light exposure, and a heat process (post baking) performed subsequently to development.

In general, these heat processes are performed by a heat processing apparatus (hot plate unit) provided with a heating plate (hot plate) heated by a heater. Conventionally, in a heat processing apparatus of this type, the following gas flow control is typically adopted to perform a heat process on a wafer as uniform as possible. Specifically, during the heat process, the heating plate is covered with a cover, in which gas flows are formed from around the heating plate toward the center, and gas is exhausted upward from the center of the cover.

In recent years, circuit patters of semiconductor devices show rapid progress in decreasing the line width, in decreasing the size, and in increasing the degree of integration, which requires the process uniformity of heat processes to be further improved. However, by use of the gas flow control described above, it has become difficult to attain desired process uniformity, particularly uniformity concerning gas flows relative to a wafer, which is necessary to uniformize critical dimensions (CD). Accordingly, it is required to provide a technique for performing a heat process with higher uniformity. As a technique for realizing a heat process with higher uniformity, Jpn. Pat. Appln. KOKAI Publication No. 2003-318091 discloses a technique for performing a heat process while supplying gas flows from above uniformly onto the entire surface of a substrate. According to this technique, since the gas flows uniformly strike the entire surface of the substrate, such as a wafer, it is possible to improve the process uniformity, particularly uniformity in the film thickness of a coating film.

However, devices for the next generation require very minute patterns with a CD value of 50 nm or less, in which even slight dust may cause a defect. Accordingly, it is necessary to swiftly remove sublimed substances and so forth generated by a heat process. In this respect, the technique disclosed in Jpn. Pat. Appln. KOKAI Publication No. 2003-318091 mentioned above cannot sufficiently remove sublimed substances and so forth, and thus it may deteriorate the yield of products. Particularly, such deterioration in the yield due to sublimed substances is easily caused in a coating film for argon fluoride (ArF) having a short wavelength. This coating film is used for further improving the resolving power of light exposure in accordance with a CD for the next generation.

Further, depending on coating films, heat processes of this kind include processes that should give weight to CD uniformity and processes that should give weight to an improvement in the product yield by removing substances, such as sublimed substances, that generate dust. However, the technique disclosed in Jpn. Pat. Appln. KOKAI Publication No. 2003-318091 mentioned above cannot address the latter type. Accordingly, there is a great demand for a heat processing technique that can address these two types.

BRIEF SUMMARY OF THE INVENTION

An object of the present invention is to provide a heat processing apparatus and heat processing method that can realize both of high uniformity and high product yield.

An alternative object of the present invention is to provide a heat processing apparatus that can perform both of a process that gives weight to high uniformity and a process that gives weight to high product yield.

A further alternative object of the present invention is to provide a computer readable storage medium that stores a control program for executing the heat processing method described above.

According to a first aspect of the present invention, there is provided a heat processing apparatus for performing a heat process on a substrate, the apparatus comprising: a heating plate configured to heat the substrate; a cover configured to surround a space above the heating plate; a first gas flow forming mechanism configured to form gas flows mainly arranged to realize a uniform heat process, within the space above the heating plate; and a second gas flow forming mechanism configured to form gas flows mainly arranged to exhaust and remove gas and/or sublimed substances generated from the substrate, within the space above the heating plate, wherein the first gas flow forming mechanism and the second gas flow forming mechanism are selectively switchable therebetween.

According to a second aspect of the present invention, there is provided a heat processing apparatus for performing a heat process on a substrate, the apparatus comprising: a heating plate configured to heat the substrate; a cover configured to surround a space above the heating plate; a first gas flow forming mechanism configured to form gas flows mainly arranged to realize a uniform heat process, within the space above the heating plate; a second gas flow forming mechanism configured to form gas flows mainly arranged to exhaust and remove gas and/or sublimed substances generated from the substrate, within the space above the heating plate; and a control mechanism configured to execute mode switching control between a mode arranged to heat the substrate while forming the gas flows by the first gas flow forming mechanism and a mode arranged to heat the substrate while forming the gas flows by the second gas flow forming mechanism.
[There are deleted portions.]

In the first or second aspect of the present invention, the first gas flow forming mechanism may be configured to form downflows uniformly supplied onto an upper surface of the substrate placed on the heating plate. The second gas flow forming mechanism may be configured to exhaust the space above the heating plate to form gas flows along the substrate.
[There are deleted portions.]

According to a third aspect of the present invention, there is provided a heat processing apparatus for performing a heat process on a substrate, the apparatus comprising: a heating plate configured to heat the substrate; a cover configured to surround a space above the heating plate; an exhaust gas flow forming mechanism configured to exhaust gas inside the cover to form exhaust gas flows within the space above the heating plate; and a downflow forming mechanism configured to form downflows uniformly supplied onto an upper surface of the substrate placed on the heating plate, wherein modes are switchable between a mode arranged to heat the substrate while forming the downflows by the downflow forming mechanism and a mode arranged to heat the substrate while forming the exhaust gas flows by the exhaust gas flow forming mechanism.

[There are deleted portions.]

In the third aspect of the present invention, the downflow forming mechanism may comprise a gas supply mechanism configured to supply a gas as a shower onto the upper surface of the substrate from a ceiling wall of the cover, and a periphery exhaust mechanism configured to exhaust gas outwardly in radial directions from the substrate. The exhaust gas flow forming mechanism may comprise an exhaust portion located at the center of a ceiling wall of the cover and a gas feed portion configured to supply a gas from around the substrate into the space above the heating plate, such that a gas is supplied from the gas feed portion and is exhausted from the exhaust portion to form exhaust gas flows from a periphery of the substrate toward a center thereof, within the space above the heating plate. Alternatively, the exhaust gas flow forming mechanism may comprise a gas feed portion and an exhaust portion respectively located on opposite sides of the space above the heating plate, such that a gas is supplied from the gas feed portion and is exhausted from the exhaust portion to form exhaust gas flows from one side of the substrate toward an opposite side thereof, within the space above the heating plate.

According to a fifth aspect of the present invention, there is provided a heat processing method for performing a heat process by use of a heat processing apparatus, which comprises a heating plate configured to heat the substrate, a cover configured to surround a space above the heating plate, a first gas flow forming mechanism configured to form gas flows mainly arranged to realize a uniform heat process, within the space above the heating plate, and a second gas flow forming mechanism configured to form gas flows mainly arranged to exhaust and remove gas and/or sublimed substances generated from the substrate, within the space above the heating plate, the method comprising: heating the substrate while forming the gas flows by the first gas flow forming mechanism; and heating the substrate while forming the gas flows by the second gas flow forming mechanism.

In the fifth aspect of the present invention, the method preferably comprises first heating the substrate while forming the gas flows by the first gas flow forming mechanism, and then heating the substrate while forming the gas flows by the second gas flow forming mechanism. Further, said heating the substrate while forming the gas flows by the first gas flow forming mechanism may be performed while forming downflows uniformly supplied onto an upper surface of the substrate placed on the heating plate. Further, said heating the substrate while forming the gas flows by the second gas flow forming mechanism may be performed while exhausting gas from the space above the heating plate to form gas flows along the substrate.

[There are deleted portions.]

According to a sixth aspect of the present invention, there is provided a heat processing method for performing a heat process by use of a heat processing apparatus, which comprises a heating plate configured to heat the substrate, a cover configured to surround a space above the heating plate, an exhaust gas flow forming mechanism configured to exhaust an atmosphere inside the cover from above or sidewise to form exhaust gas flows within the space above the heating plate, and a downflow forming mechanism configured to form downflows uniformly supplied onto an upper surface of the substrate placed on the heating plate, the method comprising: heating the substrate while forming the downflows by the downflow forming mechanism; and heating the substrate while forming the exhaust gas flows by the exhaust gas flow forming mechanism within the space above the heating plate.

[There are deleted portions.]

In the sixth aspect of the present invention, said heating the substrate while forming the downflows by the downflow forming mechanism may comprise forming the downflows by supplying a gas as a shower onto the upper surface of the substrate from a ceiling wall of the cover while exhausting gas outwardly in radial directions from the substrate. Further, said heating the substrate while forming the exhaust gas flows by the exhaust gas flow forming mechanism within the space above the heating plate may be performed while forming the exhaust gas flows from a periphery of the substrate toward a center thereof, within the space above the heating plate. Alternatively, said heating the substrate while forming the exhaust gas flows by the exhaust gas flow forming mechanism within the space above the heating plate may be performed while forming the exhaust gas flows from one side of the substrate toward an opposite side thereof, within the space above the heating plate.

[There are deleted portions.]

According to a seventh aspect of the present invention, there is provided a computer readable storage medium that stores a control program for execution on a computer used for a heat processing apparatus, which comprises a heating plate configured to heat the substrate, a cover configured to surround a space above the heating plate, a first gas flow forming mechanism configured to form gas flows mainly arranged to realize a uniform heat process, within the space above the heating plate, and a second gas flow forming mechanism configured to form gas flows mainly arranged to exhaust and remove gas and/or sublimed substances generated from the substrate, within the space above the heating plate, wherein the control program, when executed, causes the computer to control the heat processing apparatus to conduct a heat processing method comprising: heating the substrate while forming the gas flows by the first gas flow forming mechanism; and heating the substrate while forming the gas flows by the second gas flow forming mechanism.

According to an eighth aspect of the present invention, there is provided a computer readable storage medium that stores a control program for execution on a computer used for a heat processing apparatus, which comprises a heating plate configured to heat the substrate, a cover configured to surround a space above the heating plate, an exhaust gas flow forming mechanism configured to exhaust an atmosphere inside the cover from above or sidewise to form exhaust gas flows within the space above the heating plate, and a downflow forming mechanism configured to form downflows uniformly supplied onto an upper surface of the substrate placed on the heating plate, wherein the control program, when executed, causes the computer to control the heat processing apparatus to conduct a heat processing method comprising: heating the substrate while forming the downflows by the downflow forming mechanism; and heating the substrate while forming the exhaust gas flows by the exhaust gas flow forming mechanism within the space above the heating plate.

According to the present invention, there is provided a heat processing apparatus comprising: a first gas flow forming mechanism configured to form gas flows mainly arranged to realize a uniform heat process, within the space above the heating plate; and a second gas flow forming mechanism configured to form gas flows mainly arranged to exhaust and remove gas and/or sublimed substances generated from the substrate, within the space above the heating plate, wherein the first gas flow forming mechanism and the second gas flow forming mechanism are selectively switchable therebetween. More specifically, there is provided a heat processing apparatus comprising: an exhaust gas flow forming mechanism configured to exhaust gas inside the cover to form exhaust gas flows within the space above the heating plate; and a downflow forming mechanism configured to form downflows uniformly supplied onto an upper surface of the substrate placed on the heating plate, wherein modes are switchable between a mode arranged to heat the substrate while forming the downflows by the downflow forming mechanism and a mode arranged to heat the substrate while forming the exhaust gas flows by the exhaust gas flow forming mechanism. Consequently, it is possible to perform both of a process that gives weight to high uniformity and a process that gives weight to high product yield, in accordance with a substrate.

Further, since the apparatus is controlled to switch these modes therebetween, it is possible to serially perform a process that gives weight to high uniformity and a process that gives weight to high product yield, thereby realizing both of high uniformity and high product yield.

DETAILED DESCRIPTION OF THE INVENTION

Figure 1:
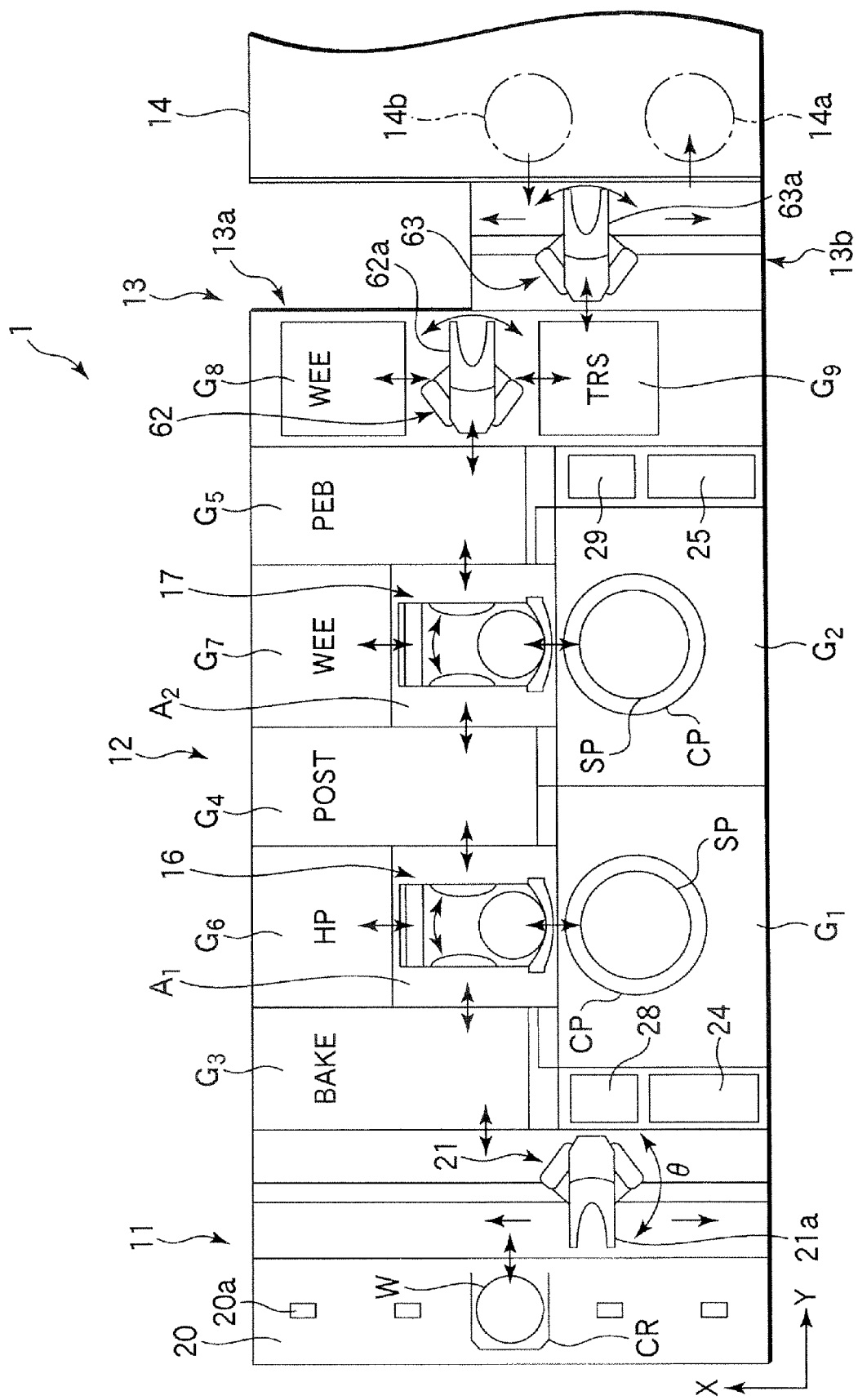
FIG. 1 is a plan view showing the entire structure of a resist coating/developing system for semiconductor wafers, which is provided with a heat processing unit according to an embodiment of the present invention.
Figure 2:
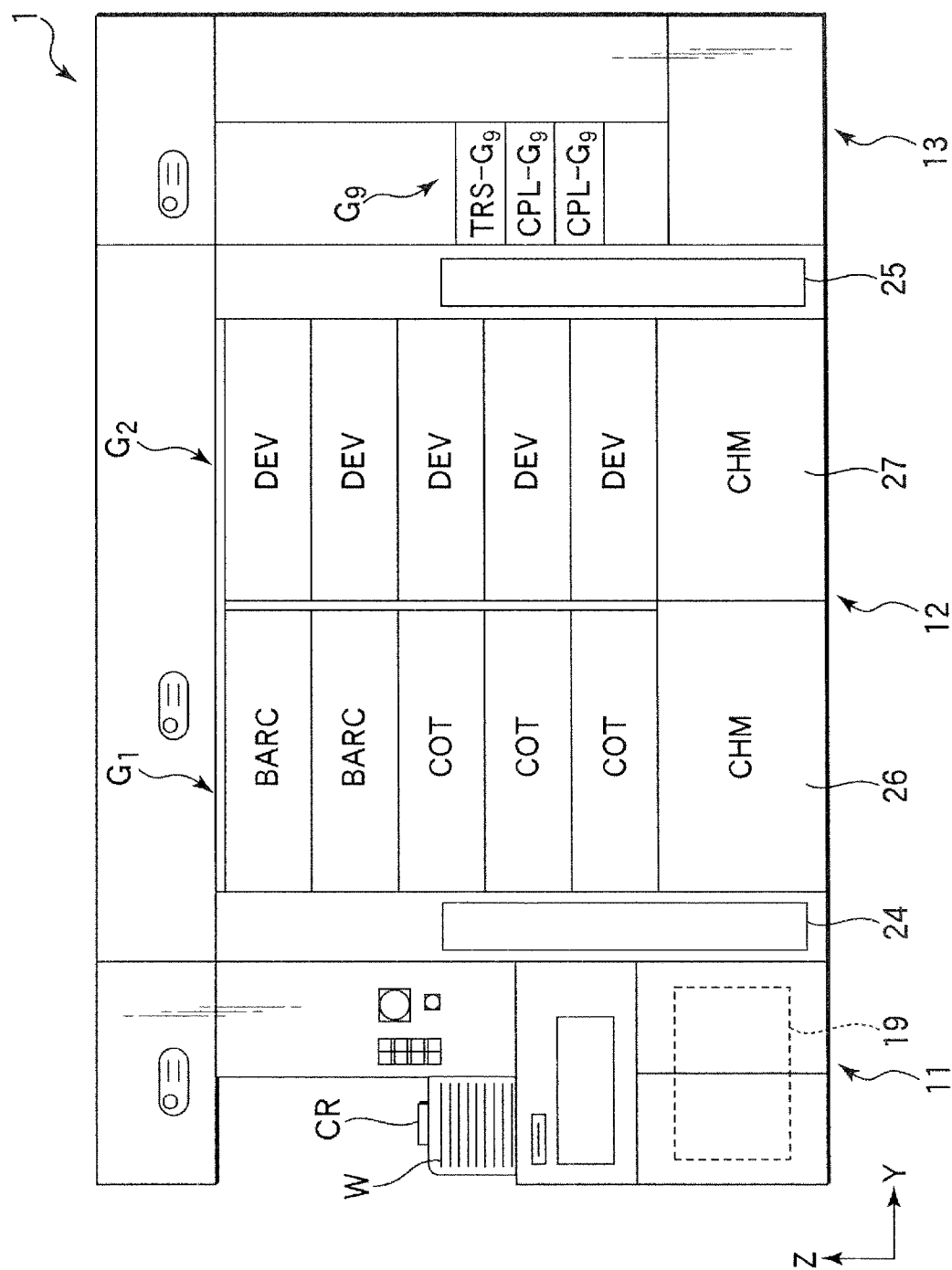
FIG. 2 is a front view of the resist coating/developing system shown in FIG. 1.
Figure 3:
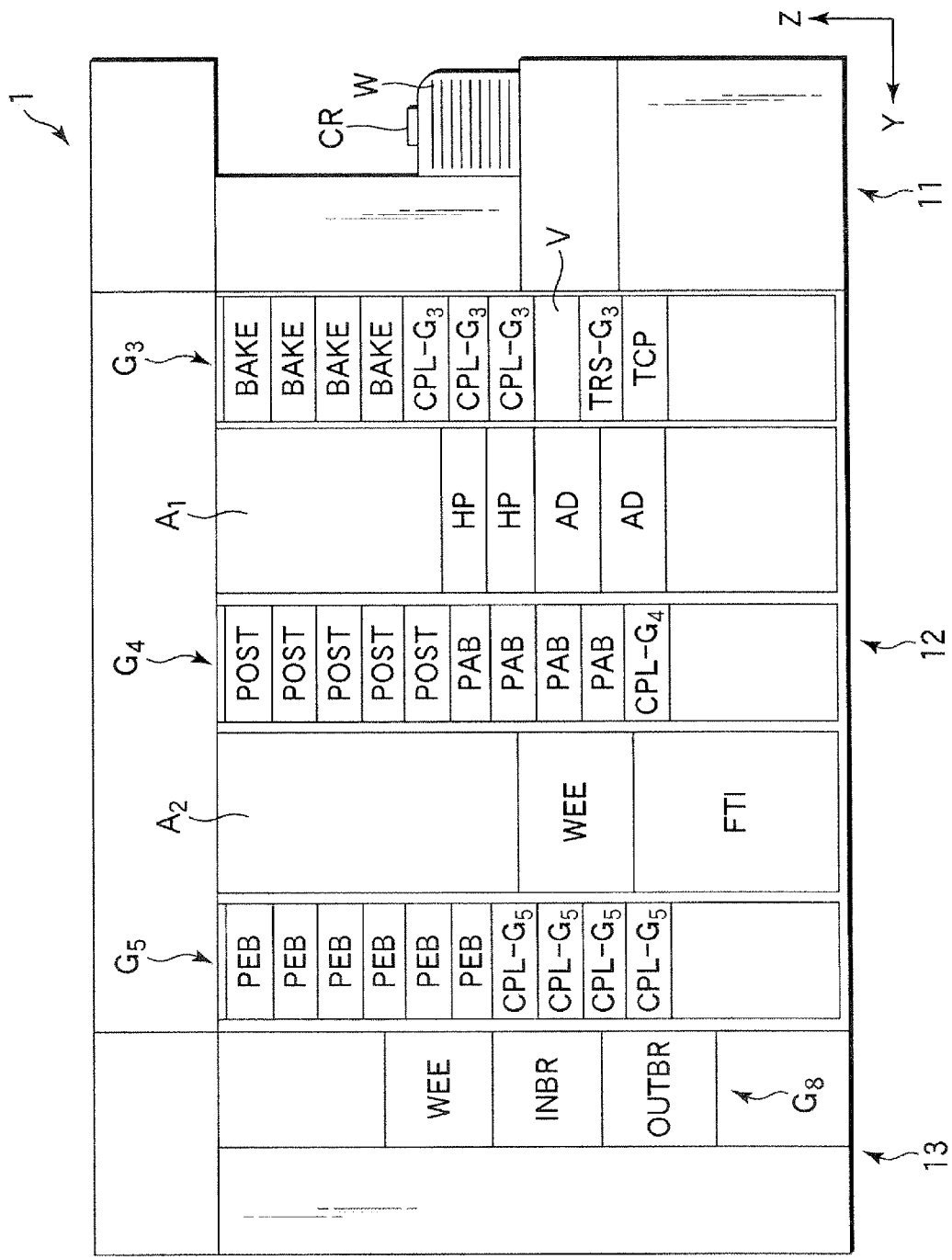
FIG. 3 is a back view of the resist coating/developing system shown in FIG. 1.

Embodiments of the present invention will now be described with reference to the accompanying drawings. FIG. 1 is a plan view schematically showing a resist coating/developing system for semiconductor wafers, which is provided with a heat processing unit according to an embodiment of the present invention. FIGS. 2 and 3 are a front view and a back view, respectively, of the resist coating/developing system shown in FIG. 1.

This resist coating/developing system 1 includes a transfer station used as a cassette station 11, a process station 12 comprising a plurality of processing units, and an interface station 13 located adjacent to the process station 12 and configured to transfer wafers W between a light exposure apparatus 14 and the process station 12.

The cassette station 11 is used such that wafer cassettes (CR) are transferred thereto from other systems, wherein each of these wafer cassettes (CR) stores a plurality of wafers W to be processed in the resist coating/developing system 1. The cassette station 11 is also arranged such that wafer cassettes (CR) are transferred therefrom to other systems, wherein each of these wafer cassettes (CR) stores wafers W processed in the resist coating/developing system 1. Further, the cassette station 11 is used to transfer wafers W between the wafer cassettes (CR) and process station 12.

As shown in FIG. 1, the cassette station 11 includes a cassette table 20 having a plurality of (five in FIG. 1) positioning projections 20a formed thereon in a row in an X-direction. A wafer cassette (CR) is placed at each of the projections 20a such that its wafer transfer port faces the process station 12.

The cassette station 11 is provided with a wafer transfer mechanism 21 located between the cassette table 20 and process station 12. This wafer transfer mechanism 21 includes a wafer transfer pick 21a, which is movable in a cassette array direction (X-direction) and in a wafer array direction (Z-direction) of the wafers W stored in each wafer cassette (CR), and is further rotatable in a θ-direction show in FIG. 1. With the arrangement described above, the wafer transfer pick 21a can access any one of the wafer cassettes (CR), and also can access a transition unit (TRS-G3) located in a third processing unit group G3 of the process station 12 described later.

On the front side of the system, the process station 12 includes a first processing unit group G1 and a second processing unit group G2 arrayed in this order from the cassette station 11. Further, on the rear side of the system, the process station 12 includes a third processing unit group G3, a fourth processing unit group G4, and a fifth processing unit group G5 arrayed in this order from the cassette station 11. A first main transfer section A1 is interposed between the third processing unit group G3 and fourth processing unit group G4. A second main transfer section A2 is interposed between the fourth processing unit group G4 and fifth processing unit group G5. A sixth processing unit group G6 is located on the rear side of the first main transfer section A1. A seventh processing unit group G7 is located on the rear side of the second main transfer section A2.

As shown in FIGS. 1 and 2, the first processing unit group G1 includes five processing units of the spinner type stacked one on the other, which are used as liquid supply units each for performing a predetermined process on a wafer W placed on a spin chuck SP inside a cup (CP). For example, the five processing units are formed of three resist coating units (COT) and two bottom coating units (BARC) for forming an anti-reflective coating that prevents reflection of light during light exposure. The second processing unit group G2 includes five processing units of the spinner type, such as development units (DEV), stacked one on the other.

The third processing unit group G3 includes ten units or the like stacked one on the other, as shown in FIG. 3, which are formed of a temperature adjusting unit (TCP), a transition unit (TRS-G3), a spare space V, three high-precision temperature adjusting units (CPL-G3), and four high-temperature heat processing units (BAKE) in this order from below. The transition unit (TRS-G3) is used as a portion for transferring a wafer W between the cassette station 11 and first main transfer section A1. The spare space V is used for attaching a desired processing unit of the oven type, such as a processing unit of the oven type for performing a predetermined process on a wafer W placed on a worktable. Each of the high-precision temperature adjusting units (CPL-G3) is used for performing a heat process on a wafer W at a temperature controlled with high precision. Each of the high-temperature heat processing units (BAKE) is used for performing a predetermined heat process on a wafer W.

The fourth processing unit group G4 includes ten units or the like stacked one on the other, as shown in FIG. 3, which are formed of a high-precision temperature adjusting unit (CPL-G4), four pre-baking units (PAB), and five post baking units (POST) in this order from below. Each of the pre-baking units (PAB) is used for performing a heat process on a wafer W after resist coating. Each of the post baking units (POST) is used for performing a heat process on a wafer W after a developing process.

The fifth processing unit group G5 includes ten units or the like stacked one on the other, as shown in FIG. 3, which are formed of four high-precision temperature adjusting units (CPL-G5) and six post exposure baking units (PEB) in this order from below. Each of the post exposure baking units (PEB) is used for performing a heat process on a wafer W after light exposure and before development.

The high-temperature heat processing units (BAKE), pre-baking units (PAB), post baking units (POST), and post exposure baking units (PEB) located in the third to fifth processing unit groups G3 to G5 have the same structure, as described later, which forms a heat processing unit according to this embodiment. In the third to fifth processing unit groups G3 to G5, the number and position of units stacked one on the other are not limited to those shown in the drawings, and they can be arbitrarily preset.

The sixth processing unit group G6 includes four units or the like stacked one on the other, which are formed of two adhesion units (AD) and two heating units (HP) for heating a wafer W in this order from below. Each of the adhesion units (AD) may have a mechanism for adjusting the temperature of a wafer W. The seventh processing unit group G7 includes two units or the like stacked one on the other, which are formed of a film thickness measuring unit (FTI) and a periphery light exposure unit (WEE) in this order from below. The film thickness measuring unit (FTI) is used for measuring the thickness of a resist film. The periphery light exposure unit (WEE) is used for performing light exposure selectively only on the edge portion of a wafer W. A plurality of periphery light exposure units (WEE) may be used and stacked one the other. Further, on the rear side of the second main transfer section A2, a heat processing unit, such as a heating unit (HP), may be disposed, as in the rear side of the first main transfer section A1.

The first main transfer section A1 is provided with a first main wafer transfer unit 16, which can selectively access the units located in the first processing unit group G1, third processing unit group G3, fourth processing unit group G4, and sixth processing unit group G6. The second main transfer section A2 is provided with a second main wafer transfer unit 17, which can selectively access the units located in the second processing unit group G2, fourth processing unit group G4, fifth processing unit group G5, and seventh processing unit group G7.

Figure 4:
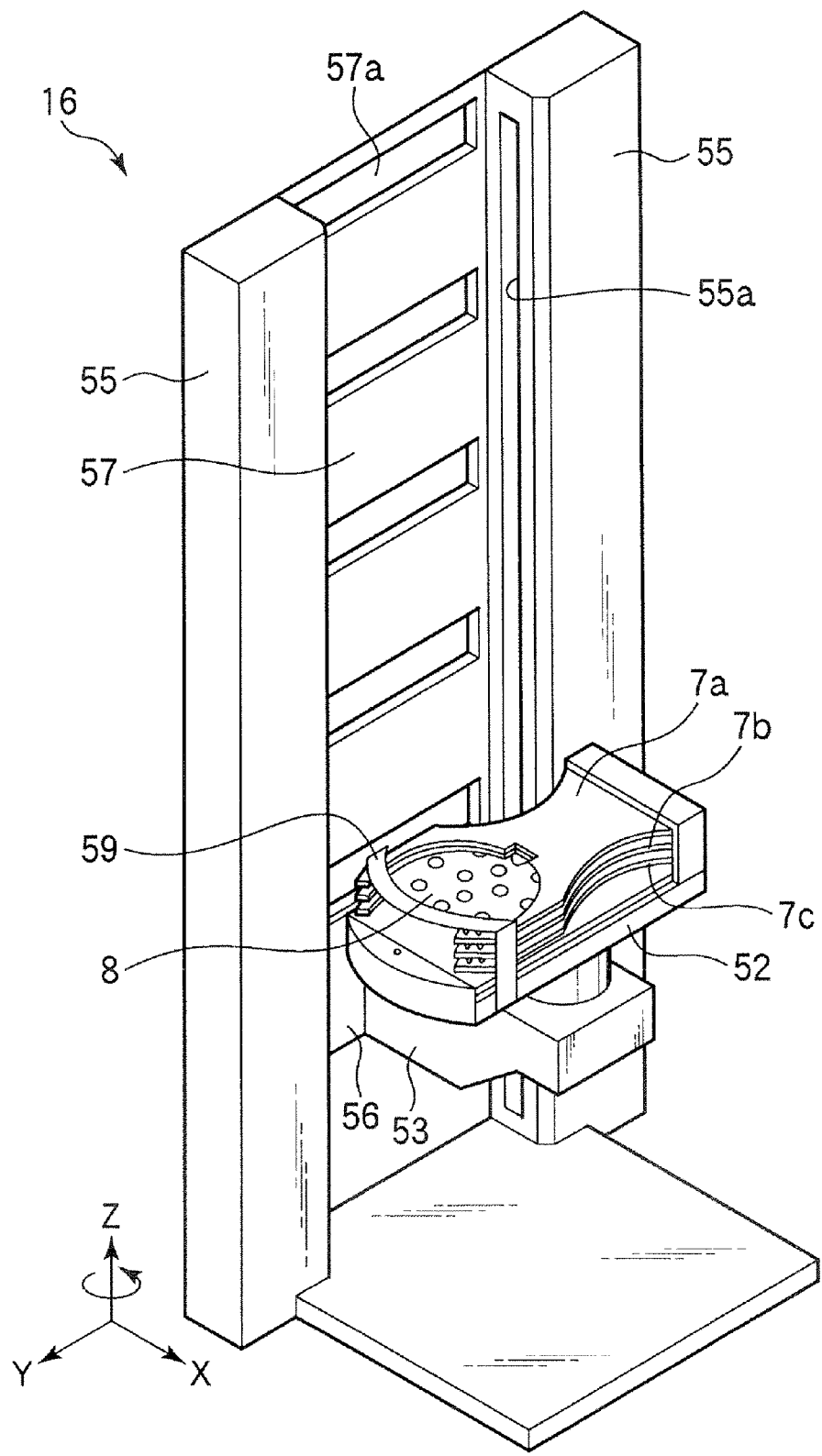
FIG. 4 is a perspective view schematically showing the structure of a main wafer transfer unit used in the resist coating/developing system shown in FIG. 1.

As shown in FIG. 4, the first main wafer transfer unit 16 includes three arms 7a, 7b, and 7c each for holding a wafer W. These arms 7a to 7c are movable back and forth along a base plate 52. The base plate 52 is rotatably supported by a support portion 53 and can be rotated by a motor built in the support portion 53. The support portion 53 is movable up and down along support struts 55 extending in the vertical direction. The support struts 55 are respectively provided with sleeves 55a extending in a vertical direction, while a flange portion 56 laterally projected from the support portion 53 slidably engages with sleeves 55a. The support portion 53 can be moved up and down by an elevating mechanism (not shown) through the flange portion 56. With this arrangement, the arms 7a to 7c of the first main wafer transfer unit 16 are movable in the X-direction, Y-direction, and Z-direction, and is rotatable in the X-Y plane. Consequently, as described above, the first main wafer transfer unit 16 can selectively access the units located in the first processing unit group G1, third processing unit group G3, fourth processing unit group G4, and sixth processing unit group G6.

A shield plate 8 is attached between the arm 7a and arm 7b to block off radiation heat from these arms. Further, a light emitting element (not shown) of a sensor member 59 is located above the distal end of the uppermost arm 7a, while a light receiving element (not shown) is attached at the distal end of the base plate 52. The light emitting element and light receiving element constitute an optical sensor to confirm the presence/absence and protruding of a wafer W on each of the arms 7a to 7c. FIG. 4 also shows a wall portion 57 as a part of the housing of the first main transfer section A1 on the first processing unit group G1 side. The wall portion 57 has window portions 57a formed therein, through which a wafer W is transferred to and from the respectively units of the first processing unit group G1. The second main wafer transfer unit 17 has the same structure as that of the first main wafer transfer unit 16.

A liquid temperature adjusting pump 24 and a duct 28 are located between the first processing unit group G1 and cassette station 11. A liquid temperature adjusting pump 25 and a duct 29 are located between the second processing unit group G2 and interface station 13. The liquid temperature adjusting pumps 24 and 25 are used for supplying predetermined process liquids to the first processing unit group G1 and second processing unit group G2, respectively. The ducts 28 and 29 are used for supplying clean air into the processing unit groups G1 to G5 from an air conditioner (not shown) located outside the resist coating/developing system 1.

The first to seventh processing unit groups G1 to G7 are detachable for a maintenance operation. The rear side panel of the process station 12 is also detachable or openable. Further, chemical units (CHM) 26 and 27 are respectively located below the first processing unit group G1 and second processing unit group G2 and are used for supplying predetermined process liquids to the first processing unit group G1 and second processing unit group G2.

The interface station 13 comprises a first interface station 13a on the process station 12 side, and a second interface station 13b on the light exposure apparatus 14 side. The first interface station 13a is provided with a first wafer transfer device 62 that faces an opening of the fifth processing unit group G5. The second interface station 13b is provided with a second wafer transfer device 63 movable in the X-direction.

An eighth processing unit group G8 is located on the rear side of the first wafer transfer device 62. The eighth processing unit group G8 includes units or the like stacked one on the other, as shown in FIG. 3, which are formed of an outgoing buffer cassette (OUTBR), an incoming buffer cassette (INBR), and a periphery light exposure unit (WEE) in this order from below. The outgoing buffer cassette (OUTBR) is used for temporarily placing wafers W transferred from the light exposure apparatus 14. The incoming buffer cassette (INBR) is used for temporarily placing wafers W to be transferred into the light exposure apparatus 14. Each of the incoming buffer cassette (INBR) and outgoing buffer cassette (OUTBR) is configured to accommodate a plurality of, e.g., 25, wafers W. Further, a ninth processing unit group G9 is located on the front side of the first wafer transfer device 62. The ninth processing unit group G9 includes units or the like stacked one on the other, as shown in FIG. 2, which are formed of two high-precision temperature adjusting units (CPL-G9) and a transition unit (TRS-G9) in this order from below.

The first wafer transfer device 62 includes a wafer transfer fork 62a, which is movable in the Z-direction, rotatable in the θ-direction, and further movable back and forth in the X-Y plane. This fork 62a can selectively access the units located in the fifth processing unit group G5, eighth processing unit group G8, and ninth processing unit group G9, so that wafers W can be transferred among these units.

Similarly, the second wafer transfer device 63 includes a wafer transfer fork 63a, which is movable in the X-direction and Z-direction, rotatable in the θ-direction, and further movable back and forth in the X-Y plane. This fork 63a can selectively access the units located in the ninth processing unit group G9, and an incoming stage 14a and an outgoing stage 14b of the light exposure apparatus 14, so that wafers W can be transferred among these portions.

Figure 5:
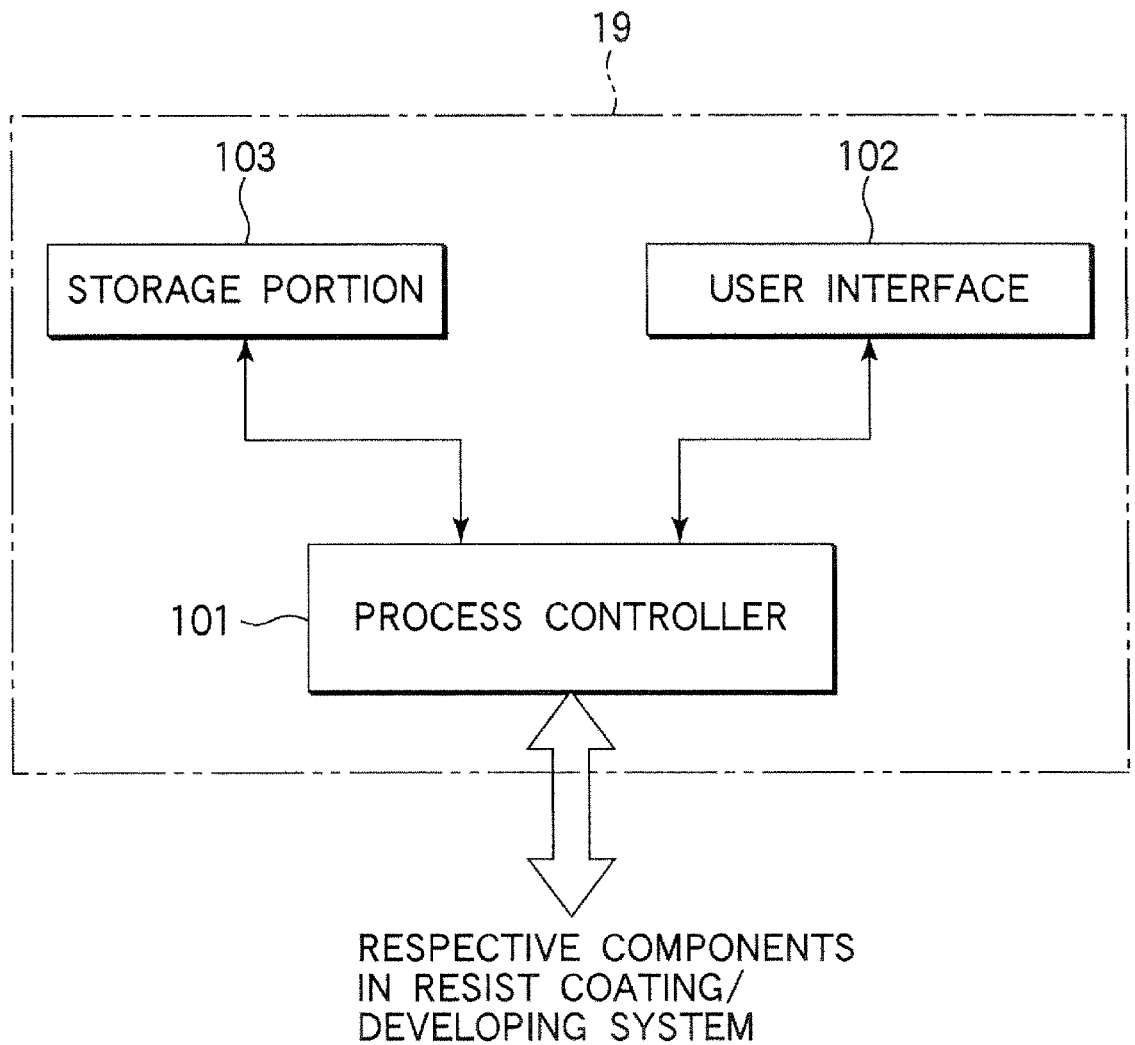
FIG. 5 is a block diagram showing a control system used in the resist coating/developing system shown in FIG. 1.

As shown in FIG. 2, a central control section 19 is located below the cassette station 11 and is used for controlling this resist coating/developing system 1, as a whole. As shown in FIG. 5, this central control section 19 includes a process controller 101 comprising a CPU for controlling the respective components included in the resist coating/developing system 1, such as the processing units and transfer mechanisms. The process controller 101 is connected to the user interface 102, which includes, e.g., a keyboard and a display, wherein the keyboard is used for a process operator to input commands for operating the respective components in the resist coating/developing system 1, and the display is used for showing visualized images of the operational status of the respective components in the resist coating/developing system 1. Further, the process controller 101 is connected to the storage portion 103, which stores recipes with control programs and process condition data recorded therein, for realizing various processes performed in the resist coating/developing system 1 under the control of the process controller 101.

A required recipe is retrieved from the storage portion 103 and executed by the process controller 101 in accordance with an instruction or the like input through the user interface 102. Consequently, each of various predetermined processes is performed in the resist coating/developing system 1 under the control of the process controller 101. Recipes may be stored in a computer readable storage medium, such as a CD-ROM, hard disk, flexible disk, or nonvolatile memory. Further, recipes may be utilized on-line, while it is transmitted from a suitable apparatus through, e.g., a dedicated line, as needed. Each of the respective components is provided with its own subordinate control section, which control the operation of the corresponding component in accordance with instructions transmitted from the process controller 101.

In the resist coating/developing system 1 arranged as described above, unprocessed wafers W are taken out one by one from a wafer cassette (CR) by the wafer transfer mechanism 21. A wafer W thus taken out is transferred by the wafer transfer mechanism 21 into the transition unit (TRS-G3) located in the processing unit group G3 of the process station 12. Then, the wafer W receives a temperature adjusting treatment in the temperature adjusting unit (TCP). Then, the wafer W is sequentially subjected to formation of an anti-reflective coating performed by one of the bottom coating units (BARC) of the first processing unit group G1, a heat process performed by one of the heating units (HP), and a baking process performed by one of the high-temperature heat processing units (BAKE). Before the formation of an anti-reflective coating performed by one of the bottom coating units (BARC), the wafer W may be subjected to an adhesion process performed by one of the adhesion units (AD). Then, the wafer W receives a temperature adjusting treatment in the high-precision temperature adjusting unit (CPL-G4). Then, the wafer W is transferred into one of the resist coating unit (COT) located in the first processing unit group G1, in which the wafer W is subjected to a process for applying a resist liquid. Thereafter, the wafer W is sequentially subjected to a pre-baking process performed by one of the pre-baking units (PAB) located in the fourth processing unit group G4, and a periphery light exposure process performed by one of the periphery light exposure units (WEE). Then, the wafer W receives a temperature adjusting treatment in the high-precision temperature adjusting unit (CPL-G4) or the like. Thereafter, the wafer W is transferred by the second wafer transfer device 63 into the light exposure apparatus 14. After the wafer W is subjected to a light exposure process performed by the light exposure apparatus 14, the wafer W is transferred by the second wafer transfer device 63 into the transition unit (TRS-G9). Then, the wafer W is transferred by the first wafer transfer device 62 into one of the post exposure baking units (PEB) located in the fifth processing unit group G5, in which the wafer W is subjected to a post exposure baking process. Further, the wafer W is transferred into one of the development units (DEV) located in the second processing unit group G2, in which the wafer W is subjected to a developing process. Then, the wafer W is subjected to a post baking process performed by the post baking unit (POST) Then, the wafer W receives a temperature adjusting treatment in one of the high-precision temperature adjusting units (CPL-G3). Then, the wafer W is transferred by the transition unit (TRS-G3) to a predetermined position in a wafer cassette (CR) placed on the cassette station 11.

Figure 6:
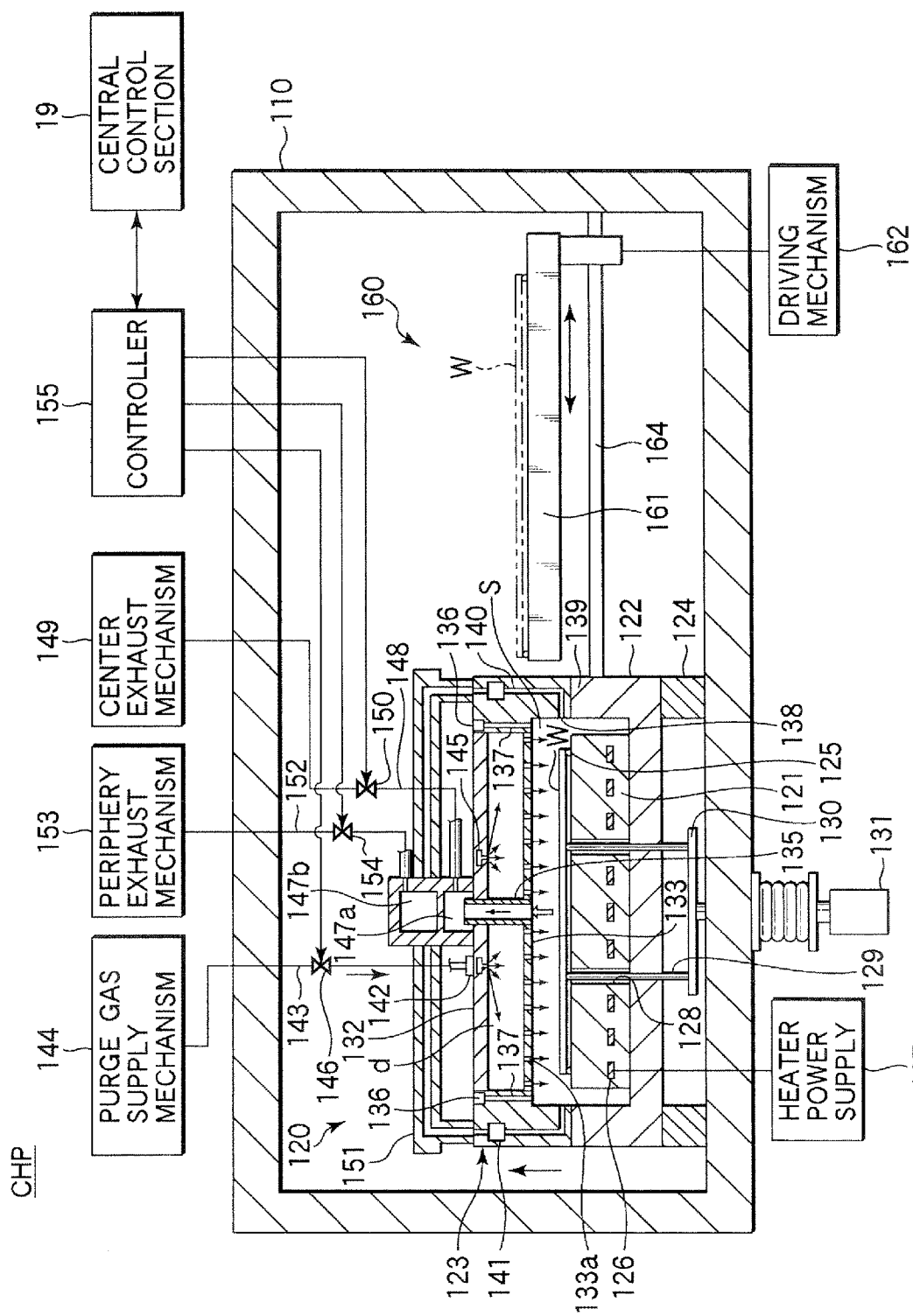
FIG. 6 is a sectional view showing a heat processing unit according to an embodiment of the present invention.
Figure 7:
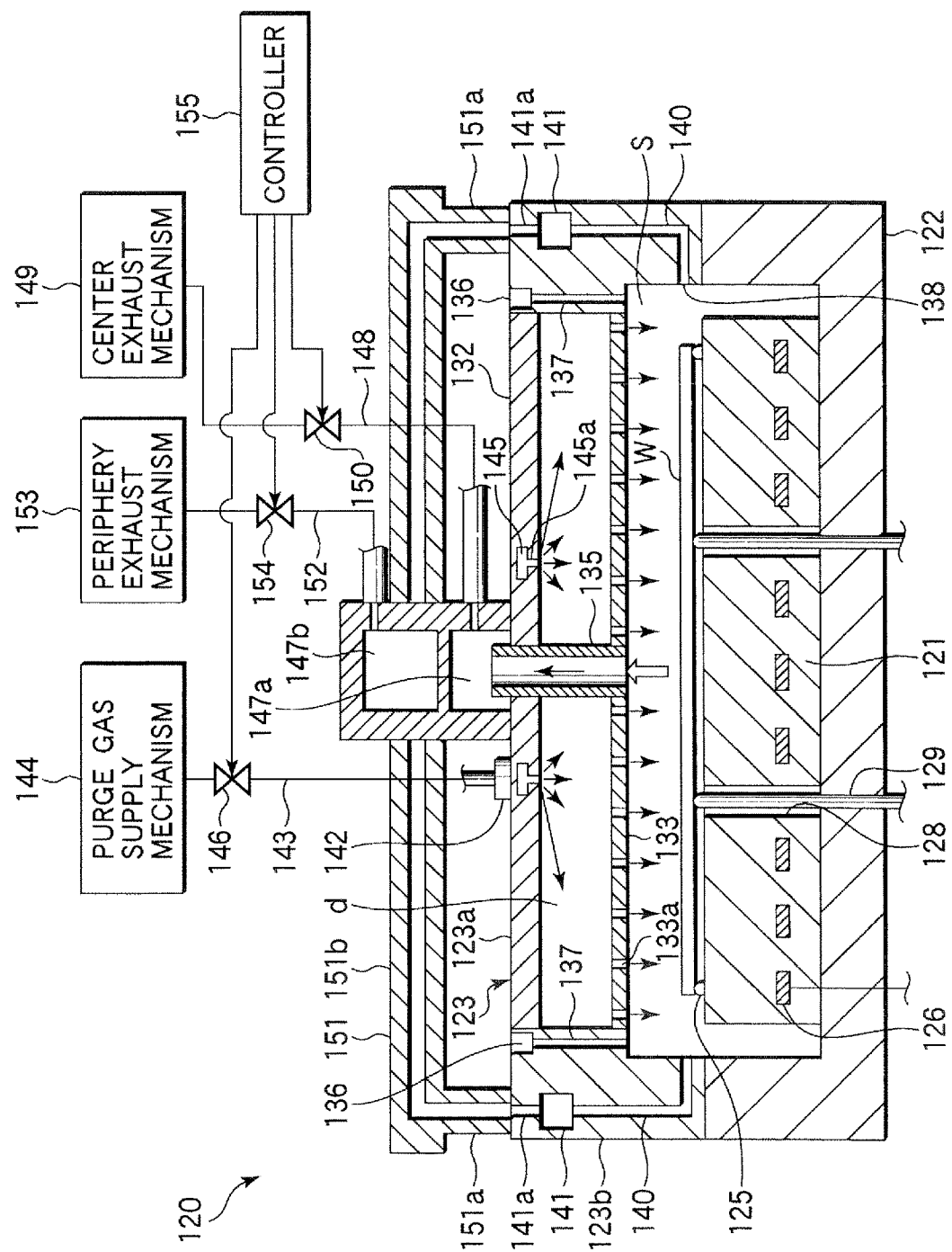
FIG. 7 is an enlarged sectional view showing a heating section used in the heat processing unit according to an embodiment of the present invention.
Figure 8:
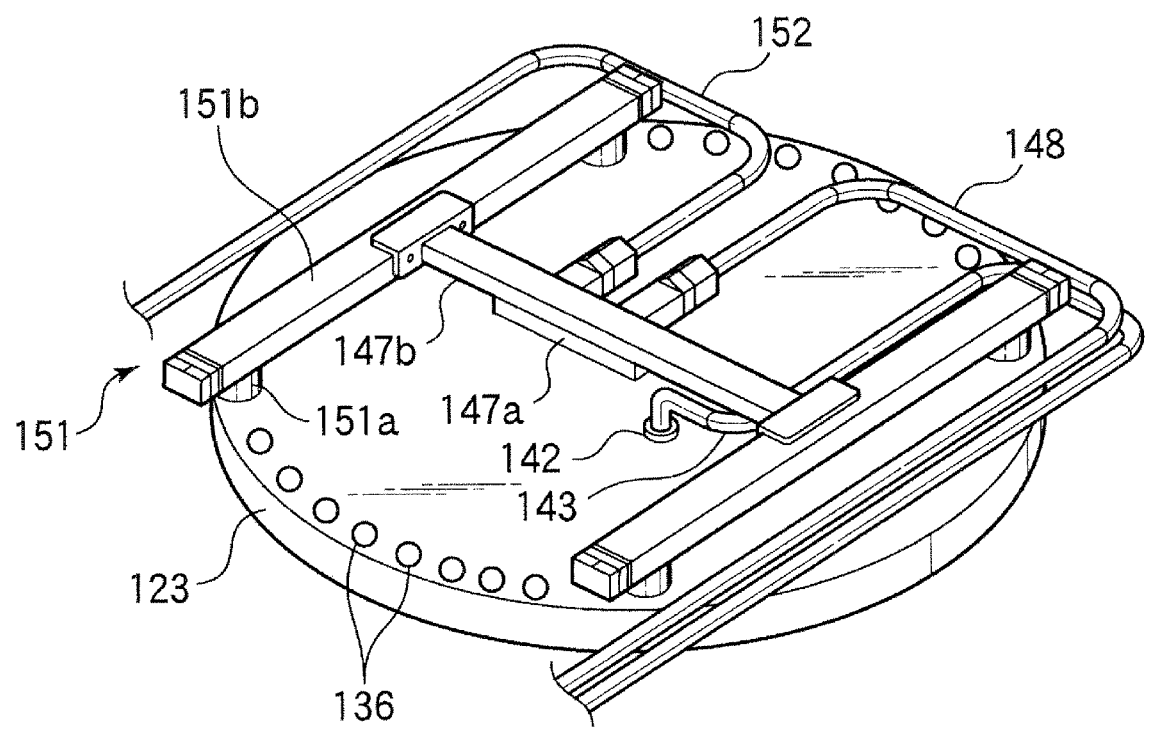
FIG. 8 is a perspective view showing the cover of the heating section used in the heat processing unit according to an embodiment of the present invention.
Figure 9:
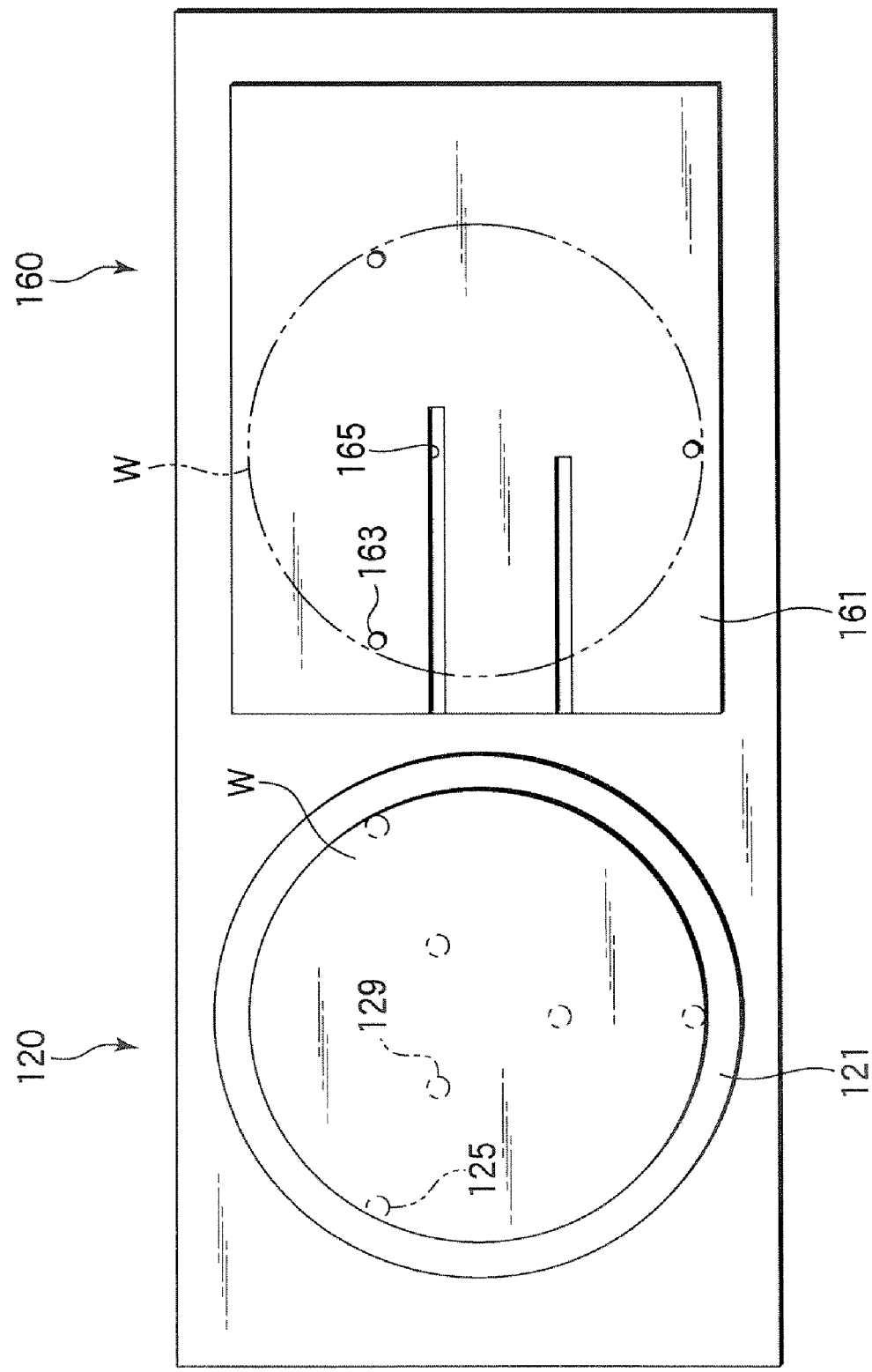
FIG. 9 is a plan view schematically showing the interior of the heat processing unit according to an embodiment of the present invention.

Next, a detailed explanation will be given of the heat processing unit according to an embodiment of the present invention. As described above, the high-temperature heat processing units (BAKE), pre-baking units (PAB), post baking units (POST), and post exposure baking units (PEB) have the same structure, which forms a heat processing unit according to this embodiment, i.e., a heat processing unit (CHP) provided with a cooling plate. FIG. 6 is a sectional view showing the heat processing unit according to this embodiment. FIG. 7 is an enlarged sectional view showing a heating section used in the heat processing unit. FIG. 8 is a perspective view showing the cover of the heating section used in the heat processing unit. FIG. 9 is a plan view schematically showing the interior of the heat processing unit.

This heat processing unit (CHP) includes a casing 110, in which a heating section 120 is located on one side, and a cooling section 160 is located on the other side.

The heating section 120 includes a heating plate 121 like a circular plate for heating a wafer W. The heating plate 121 is supported within the inner space of a support member 122 having a compressed circular cylindrical shape opened upward. The upper side of the support member 122 is covered with a cover 123 having a compressed circular cylindrical shape opened downward. The cover 123 can be moved up and down by an elevating mechanism (not shown). When the cover 123 is set at the upper position, the wafer W can be loaded and unloaded to and from the heating plate 121. When the cover 123 is set at the lower position, the lower end of the cover 123 comes into close contact with the upper end of the support member 122 to form a heat processing space S. The support member 122 is fixed on a spacer 124 placed on the bottom of the casing 110.

The heating plate 121 is made of, e.g., aluminum, and is provided with proximity pins 125 on the surface. The wafer W is placed on the proximity pins 125 to be adjacent to the heating plate 121. The heating plate 121 has an electric heater 126 built therein with a predetermined pattern. Electricity is applied from a heater power supply 127 to this electric heater 126 to set the heating plate 121 at a predetermined temperature. The heating temperature is controlled by means of feedback control using a thermo couple (not shown) located near the surface of the heating plate 121.

The heating plate 121 has three through holes 128 formed therein at the central portion (only two of them are shown in FIG. 6). Lifter pins 129 are respectively inserted in these through holes 128 and are movable up and down to move the wafer W up and down. The lifter pins 129 are attached to a support plate 130 and are moved up and down along with the support plate 130 by a cylinder mechanism 131 located below the casing 110.

As shown in the enlarged view of FIG. 7, the cover 123 is formed of a ceiling wall 123a and a sidewall 123b. The ceiling wall 123a includes an upper plate 132 and a lower plate 133, which define a gas diffusion space d therebetween. Further, the lower plate 133 of the ceiling wall 123a has a number of gas delivery holes 133a uniformly distributed. An exhaust pipe 135 is formed to penetrate the center of the ceiling wall 123a in the vertical direction. The sidewall 123b of the cover 123 has a plurality of air intake ports 136 opened on the upper surface and arrayed in an annular direction. A plurality of air feed passages 137 are formed in the sidewall 123b to connect the air intake ports 136 to the heat processing space S. In place of the air intake ports 136, a gas feed mechanism for supplying another gas, such as $N_2$ gas, may be used.

The sidewall 123b of the cover 123 further has a plurality of gas exhaust ports 138 opened on the inner surface and arrayed along a lower side of the inner surface. A plurality of vertical exhaust passages 140 are formed in the sidewall 123b such that they extend horizontally from the gas exhaust ports 138 and then extend vertically upward. Further, a loop exhaust passage 141 is formed in an upper side of the sidewall 123b, and is connected to the vertical exhaust passages 140.

The ceiling wall 123a of the cover 123 has a purge gas feed port 142 opened on the upper surface, which is connected to a purge gas supply mechanism 144 through a purge gas line 143. The purge gas feed port 142 is connected to a loop flow passage 145 formed in the upper plate 132 through a flow passage (not shown). A plurality of gas delivery ports 145a are formed below the loop flow passage 145 to deliver the purge gas as a spray. With this arrangement, a purge gas is supplied from the purge gas supply mechanism 144 through the purge gas feed port 142, flow passage (not shown), and loop flow passage 145, and is then delivered from the delivery ports 145a as a spray into the gas diffusion space d. The purge gas thus supplied into the gas diffusion space d is then delivered from the gas delivery holes 133a of the lower plate 133 into the processing space S as a shower. The purge gas line 143 is provided with a valve 146 for turning on/off the purge gas and adjusting the flow rate thereof. As the purge gas, air or an inactive gas, such as $N_2$ gas or Ar gas, is preferably used.

At the center of the upper surface of the cover 123, a first exhaust member 147a and a second exhaust member 147b are stacked one on the other in the vertical direction. The exhaust pipe 135 is inserted into the first exhaust member 147a on the lower side. The first exhaust member 147a is connected to a center exhaust mechanism 149 through an exhaust line 148. The exhaust line 148 is provided with a valve 150 for turning on/off exhaust gas and adjusting the flow rate thereof. The inner atmosphere of the heat processing space S can be exhausted by the center exhaust mechanism 149 through the exhaust passage 35, first exhaust member 147a, and exhaust line 148.

A periphery exhaust member 151 is disposed on the upper surface of the cover 123. As shown in FIG. 8, the periphery exhaust member 151 includes vertical portions 151a located at four positions on the periphery of the upper surface of the cover 123, and two horizontal portions 151b each connecting two of the four vertical portions 151a. The vertical portions 151a are connected to the loop exhaust passage 141 of the sidewall 123b through gas flow passages 141a. The central portions of the two horizontal portions 151b are connected to each other by the second exhaust member 147b. The central portion of the sidewall of the second exhaust member 147b is connected to a periphery exhaust mechanism 153 through an exhaust line 152. The exhaust line 152 is provided with a valve 154 for turning on/off exhaust gas and adjusting the flow rate thereof. The interior of the heat processing space S can be exhausted by the periphery exhaust mechanism 153 from the exhaust ports 138 through the exhaust passages 139 and 140 and loop exhaust passage 141 and further through the periphery exhaust member 151, second exhaust member 147b, and exhaust line 152.

A controller 155 is used for turning on/off and adjusting the valves 146, 150, and 154. The controller 155 controls the valves 146, 150, and 154 in accordance with instructions transmitted from the process controller 101 of the central control section 19 to switch modes between a first mode shown in FIG. 10A and a second mode shown in FIG. 10B. In the first mode, periphery exhaust is set in operation through the exhaust ports 138 while the purge gas is delivered from the gas delivery holes 133a, so that a heat process is performed while downflows are uniformly supplied onto the upper surface of the wafer W. In the second mode, air is drawn from the air intake ports 136 while gas is exhausted through the exhaust pipe 135 at the center of the ceiling wall 123a of the cover 123, so that a heat process is performed, while gas flows (exhaust gas flows) are formed along the wafer W from the periphery of the wafer W toward the center, within the heat processing space S. In other words, the purge gas supply mechanism 144, periphery exhaust mechanism 153, gas delivery holes 133a, exhaust ports 138, and lines connecting these portions constitute a first gas flow forming mechanism for forming gas flows used in the first mode. On the other hand, the center exhaust mechanism 149, exhaust pipe 135, air intake ports 136, air feed passages 137, and so forth constitute a second gas flow forming mechanism for forming gas flows used in the second mode.

The cooling section 160 includes a cooling plate 161 and a driving mechanism 162 for moving the cooling plate 161 in a horizontal direction. The cooling plate 161 is provided with proximity pins 163 thereon, so that the wafer W is placed on the proximity pins 163 to be adjacent to the cooling plate 161 during a cooling process. The driving mechanism 162 comprises a suitable mechanism, such as a belt mechanism or ball screw mechanism, to move the cooling plate 161 along a guide 164. When the wafer W is transferred to and from the heating plate 121, the cooling plate 161 is moved to the heating section 120 side. When a cooling or heating process is performed, the cooling plate 161 is set at a reference position shown in FIG. 6. In order to prevent the cooling plate 161 thus moved from interfering with the lifter pins 129, the cooling plate 161 has grooves 165 extending in a transfer direction of the cooling plate 161, as shown in FIG. 9.

The cooling plate 161 can be cooled by a cooling mechanism (not shown), and the cooling temperature is controlled by means of feedback control using a thermo couple (not shown) located near the surface of the cooling plate 161.

Figure 11:
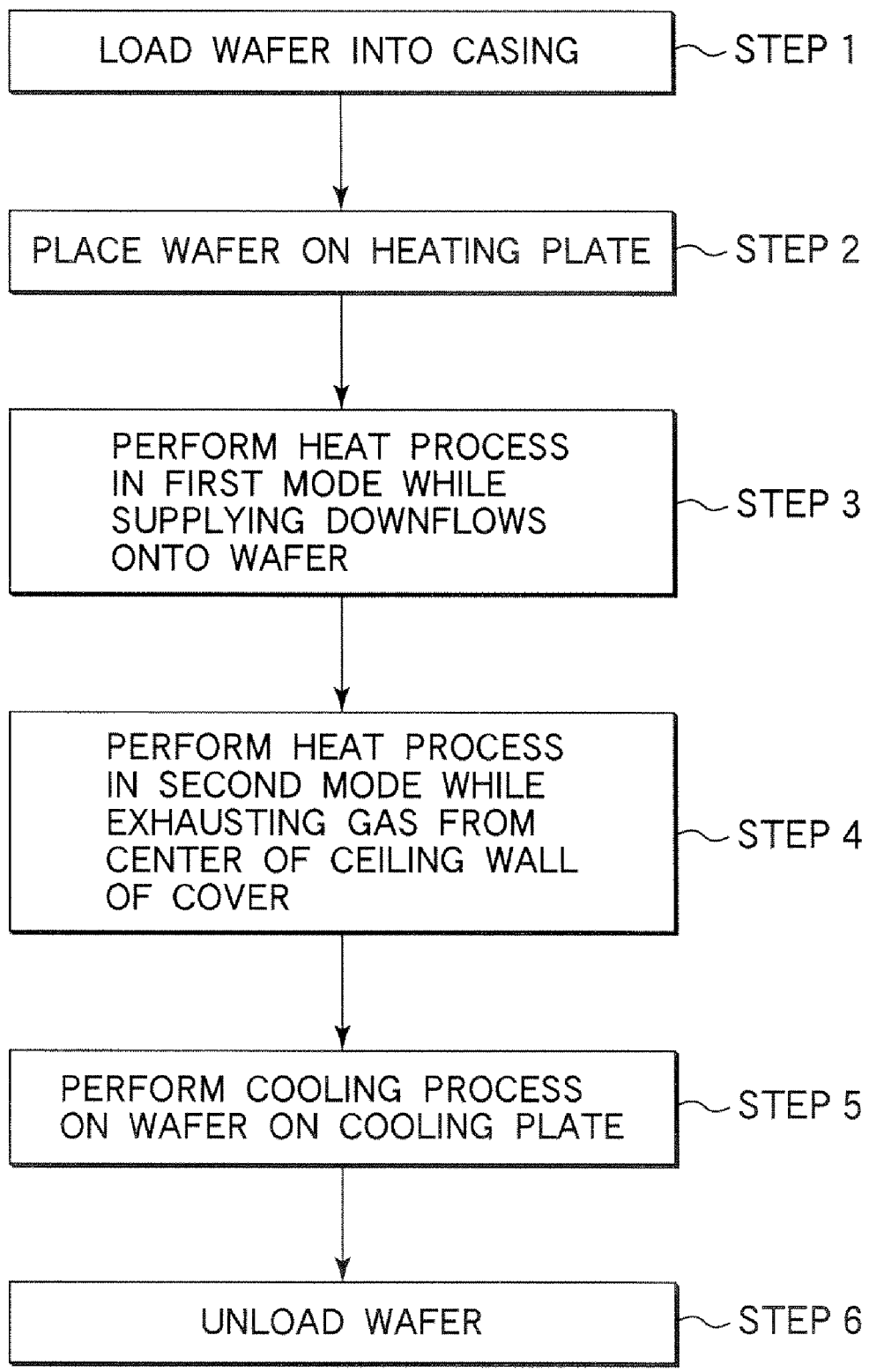
FIG. 11 is a flowchart showing a heat processing method performed in the heat processing unit according to an embodiment of the present invention.

Next, an explanation will be given of a heat processing operation performed in the heat processing unit arranged as described above, with reference to the flowchart shown in FIG. 11. This explanation will be given of a heat process performed on a wafer W with a coating liquid applied thereon.

At first, a wafer W is transferred into the casing 110 (Step 1), for example, after a predetermined coating liquid is applied thereto, or after a light exposure process is performed thereon, or after a developing process is performed thereon. At this time, the cover 123 is set at the upper position, and the wafer W is transferred onto the lifter pins 129 projecting upward from the heating plate 121. Then, the lifter pins 129 are moved down, so that the wafer W is placed on the proximity pins 125 of the heating plate 121, which is maintained at a predetermined temperature (Step 2). Then, the cover 123 is moved down to close the heat processing space S.

Figure 10A:
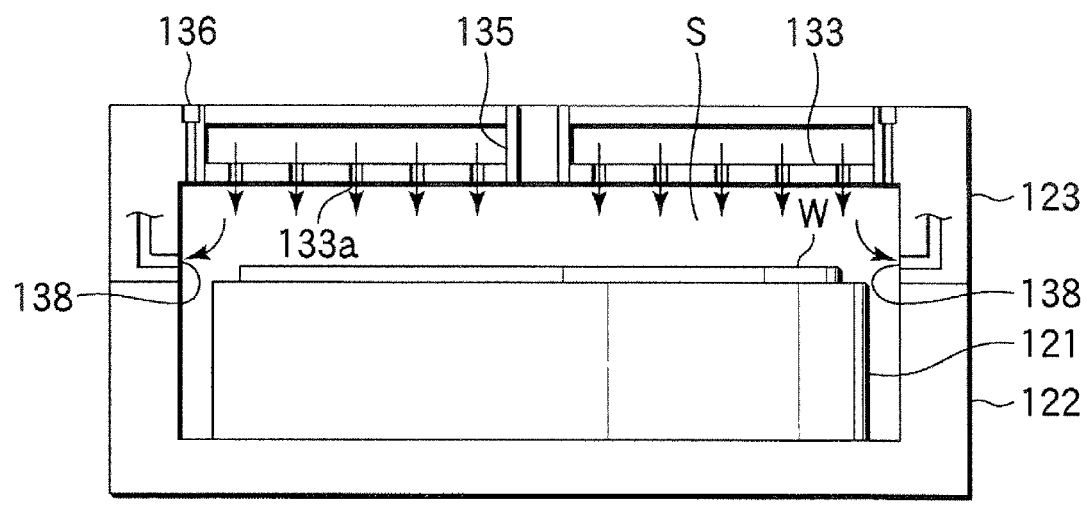
FIGS. 10A and 10B are views schematically showing the heat processing unit according to an embodiment of the present invention, set in a first mode and a second mode, respectively.

Then, a heat process is performed in the first mode shown in FIG. 10A (Step 3), in which periphery exhaust is set in operation through the exhaust ports 138 while the purge gas is delivered as a shower from the gas delivery holes 133a, so that a heat process is performed while downflows are uniformly supplied onto the upper surface of the wafer W. In this step, since gas flows are formed as downflows uniformly supplied over the entire upper surface of the wafer W, the heat process can be realized uniformly over the entire surface of the wafer W, and thus the quality of a resist film or a coating film, such as a BARC, can be made uniform. Consequently, it is possible to improve the CD uniformity after development. In this step, the valve 154 and valve 146 are controlled in accordance with instructions transmitted from the controller 155, so that the flow rate of the purge gas supplied from the purge gas supply mechanism 144 and the periphery exhaust rate from the exhaust ports 138 are controlled to form desired downflows.

Incidentally, when a wafer with a coating film formed thereon is heated, and particularly a heat process is performed immediately after the coating film is formed, a lot of gas and/or sublimed substances are generated. Conventionally, gas and/or sublimed substances of this kind do not cause a serious problem in quality. However, with a decrease in CD, e.g., to be 50 nm or less, these substances deposited on a wafer W may cause defects, thereby deteriorating the product yield. Particularly, where a baking process is performed on a wafer with a BARC for ArF formed thereon, a lot of gas and/or sublimed substances of this kind are generated and affect the process. In this respect, since the first mode comprises a step of supplying downflows onto the wafer W, arranged to give weight to uniformity, this mode is basically not suitable for removing gas and/or sublimed substances. If the first mode is modified to unreasonably increase the exhaust efficiency, the uniformity is impaired.

On the other hand, a center exhaust mode conventionally used is arranged to form gas flows along a wafer from the periphery of the wafer toward the center thereof, and to exhaust gas from the center of the ceiling wall. In this case, gas and/or sublimed substances are exhausted and removed along with the gas flows, so they are scarcely deposited on the wafer. This mode is poor in heat process uniformity, but the following matter has been found by studies made by the present inventors. Specifically, this mode, i.e., formation of such gas flows arranged to give weight to gas exhaust, does not impair the quality of a coating film, if this mode is used after the first mode is used for a heat process until the quality of the coating film is stabilized.

Figure 10B:
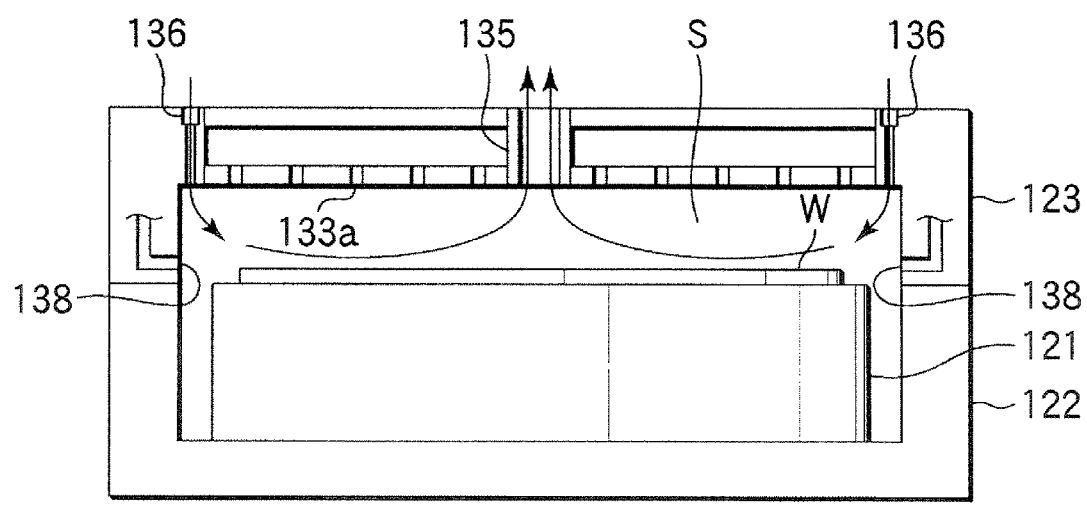

Accordingly, after the heat process is performed in the first mode, the heat process is performed in the second mode (Step 4), in which gas is exhausted through the exhaust pipe 135 at the center of the ceiling wall 123a of the cover 123. In this step, as shown in FIG. 10B, since gas is exhausted through the exhaust pipe 135, air is drawn from the air intake ports 136 through the air feed passages 137 into the heat processing space S, so that gas flows (exhaust gas flows) are formed along the wafer W from the periphery of the wafer W toward the center thereof. Consequently, gas and/or sublimed substances generated by the heat process are exhausted and removed through the exhaust passage, so they are scarcely deposited on the wafer W. Further, the gas flows thus formed can effectively remove gas and/or sublimed substances deposited on the wafer W due to the heat process being performed in the first mode. In this step, the following control is performed in accordance with instructions transmitted from the controller 155 after the heat process is performed in the first mode. Specifically, the valves 146 and 154 are closed to stop supply of the purge gas and periphery exhaust, or these valves are adjusted to form delivery flows from the gas delivery holes 133a which can hold off inflow of gas and/or sublimed substances generated from the coating film, while the valve 150 is opened to obtain a predetermined exhaust rate. Consequently, desired gas flows are formed from the periphery toward the center. The heat process is completed when the second mode is finished.

Where the heat process is a baking process performed on a 300 mm-wafer coated with a BARC for ArF laser, the first mode and second mode in Steps 3 and 4 may employ the following conditions.

Baking temperature: 180 to 220° C. (such as 215° C.)
First mode
Purge gas flow rate: 5 L/min
Periphery exhaust rate: 5 L/min
Second mode
Center exhaust rate: 20 L/min (Purge gas flow rate: 4 L/min (if necessary))

Switching timing from first mode to second mode (total 60 sec): 40 sec

Figure 12A:
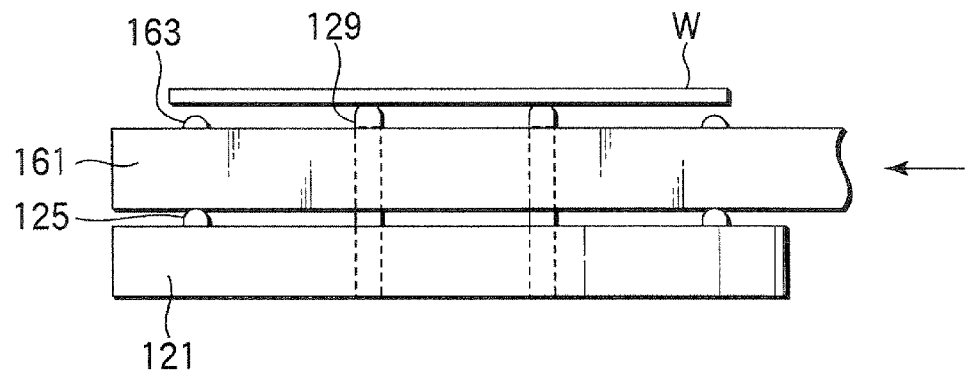
FIGS. 12A to 12C are views schematically showing the heat processing unit according to an embodiment of the present invention, to explain procedures for transferring a wafer to a cooling plate after a heat process.
Figure 12B:
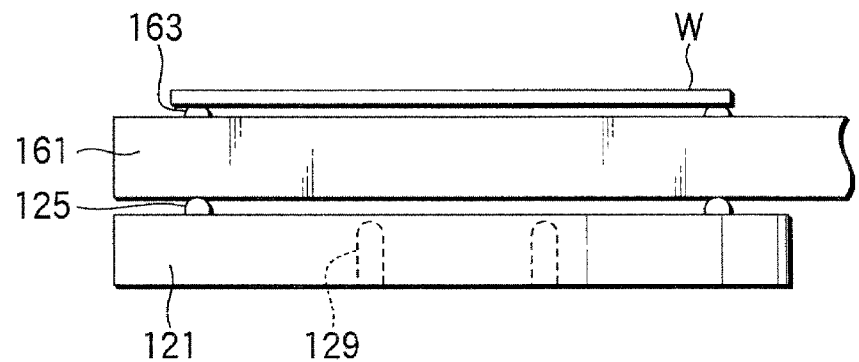
Figure 12C:
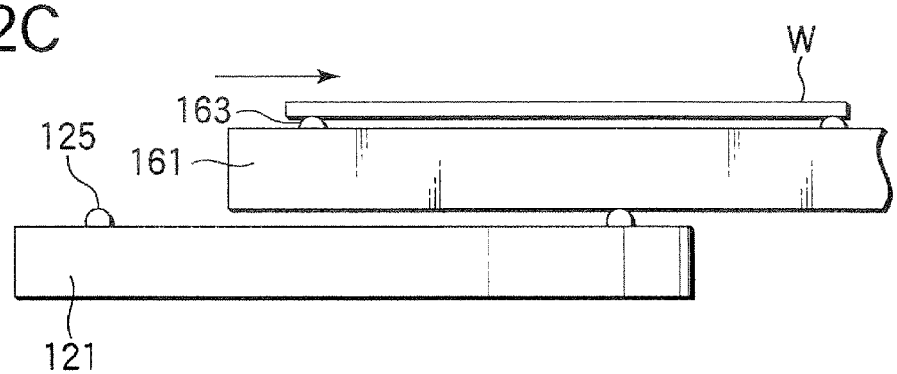

After the heat process is performed on the wafer W for a predetermined time, the wafer is placed on the cooling plate 161 and subjected to a predetermined cooling process (Step 5). The procedures for transferring the wafer at this time will be explained with reference to FIGS. 12A to 12C. At first, as shown in FIG. 12A, the wafer W is moved up by the lifter pins 129, and then the cooling plate 161 is moved to a position above the heating plate 121. Then, as shown in FIG. 12B, the lifter pins 129 is moved down to place the wafer W on the proximity pins 163 of the cooling plate 161. Then, as shown in FIG. 12C, the cooling plate 161 is moved to the original position and the cooling process is started. After this cooling process, the wafer W is unloaded through a transfer port (not shown) (Step 6). According to this heat processing unit (CHP), since cooling can be performed immediately after heating, wafers do not differ in thermal history, so fluctuations of the heat process among the wafers can be smaller.

As described above, the processing unit according to this embodiment is arranged to be switchable between the first mode and second mode. Conventionally, there is no such an idea of switching gas flow formation modes in heat processing units. In the circumstances, the present inventors have found for the first time that switching such modes in the middle of a heat process allows both of high CD uniformity and high product yield to be realized.

Next, an explanation will be given of a heat processing unit according to an alternative embodiment of the present invention.

Figure 13:
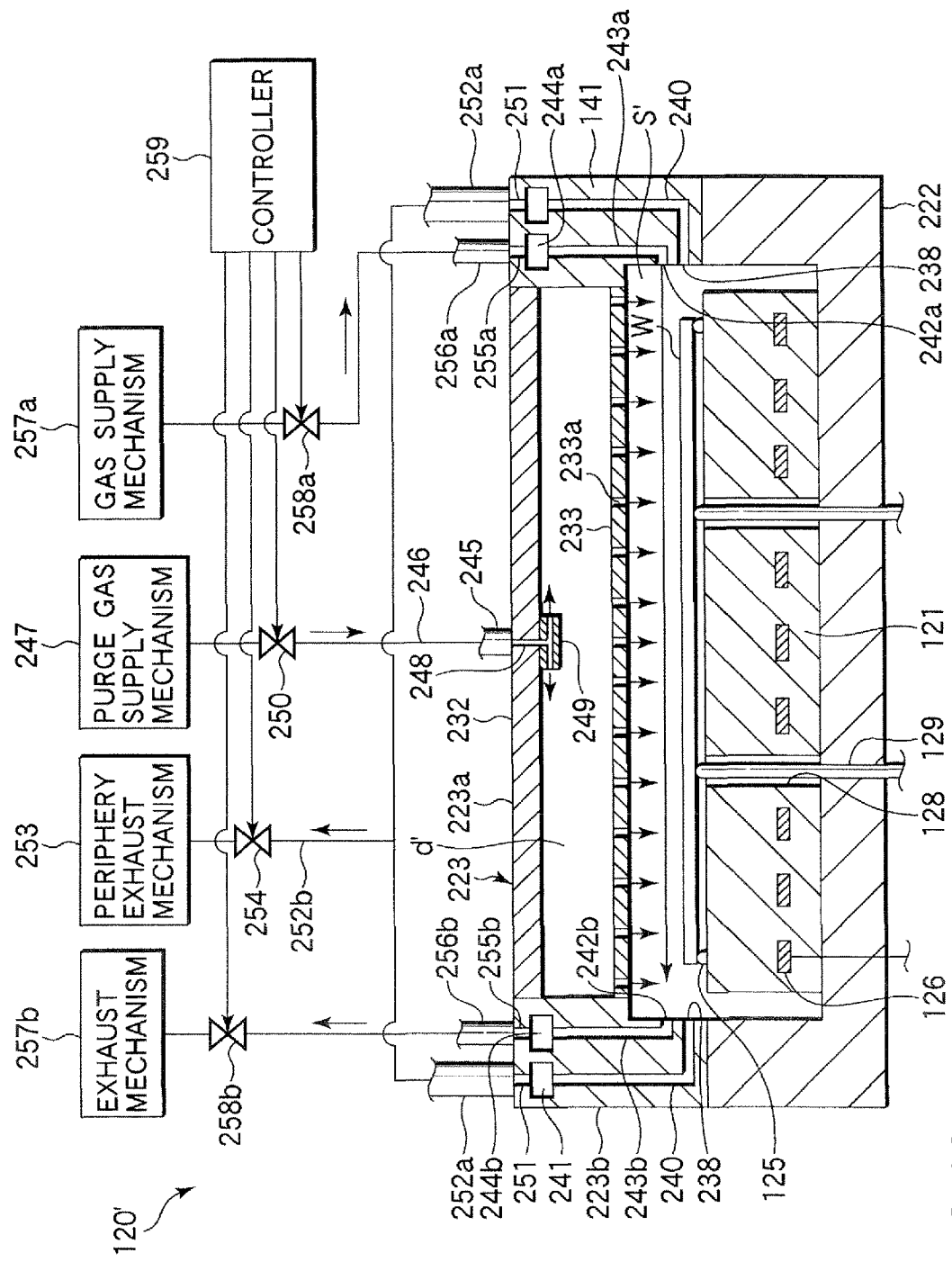
FIG. 13 is an enlarged sectional view showing a heating section used in a heat processing unit according to an alternative embodiment of the present invention.
Figure 14:
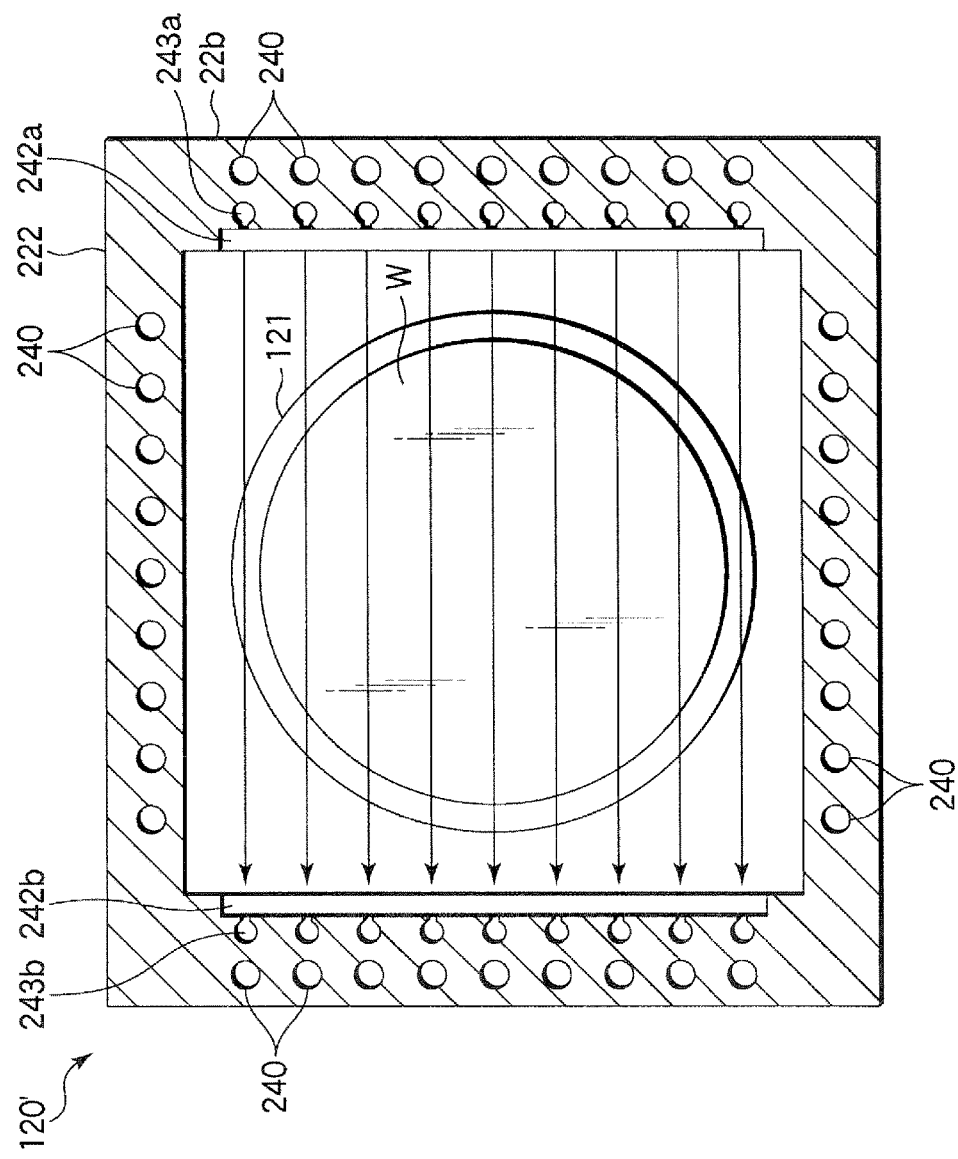
FIG. 14 is a sectional plan view schematically showing the heating section used in the heat processing unit according to an alternative embodiment of the present invention.

FIG. 13 is an enlarged sectional view showing a heating section used in a heat processing unit according to an alternative embodiment. FIG. 14 is a sectional plan view schematically showing the heating section. This embodiment has the same basic structure as that of the previous embodiment, except that a gas flow formation system of a heating section used for the second mode differs from that of the previous embodiment. Accordingly, in FIGS. 13 and 14, the same constituent elements as those described above are denoted by the same reference numerals used in FIG. 7, and their explanation will be omitted.

The heat processing unit according to this embodiment includes a casing, as in the previous embodiment, in which a heating section and a cooling section are located side by side. The heating section 120' includes a heating plate 121 structured completely the same as that of the previous embodiment. The heating plate 121 is supported within the inner space of a support member 222 and the upper side of the support member 222 is covered with a cover 223. The support member 222 has a compressed rectangular cylindrical shape opened upward, while the cover 223 has a compressed rectangular cylindrical shape opened downward. As in the cover 123 of the previous embodiment, the cover 223 can be moved up and down. When the cover 223 is set at the upper position, the wafer W can be loaded and unloaded to and from the heating plate 121. When the cover 223 is set at the lower position, the cover 223 cooperates with the support member 222 to form a heat processing space S'.

The cover 223 is formed of a ceiling wall 223a and a sidewall 223b. The ceiling wall 223a includes an upper plate 232 and a lower plate 233, which define a gas diffusion space d' therebetween. Further, the lower plate 233 of the ceiling wall 223a has a number of gas delivery holes 233a uniformly distributed.

The sidewall 223b of the cover 223 further has a plurality of gas exhaust ports 238 opened on the inner surface and arrayed along a lower side of the inner surface. A plurality of vertical exhaust passages 240 are formed in the sidewall 223b such that they extend horizontally from the gas exhaust ports 238 and then extend vertically upward. Further, a loop exhaust passage 241 is formed in an upper side of the sidewall 223b, and is connected to the vertical exhaust passages 240.

Furthermore, the sidewall 223b of the cover 223 has a gas delivery port 242a formed in a wall portion on the cooling section side at a position immediately above the heating plate 121. The gas delivery port 242a has a thin and long shape extending in a horizontal direction, and is connected to a plurality of vertical gas flow passages 243a vertically extending in this wall portion of the sidewall 223b. Further, a horizontal gas flow passage 244a extending in a horizontal direction is formed in an upper side of this wall portion, and is connected to the vertical gas flow passages 243a. On the other hand, the sidewall 223b of the cover 223 has an exhaust port 242b formed in a wall portion opposite to the wall portion described above at a position immediately above the heating plate 121. The exhaust port 242b has a thin and long shape extending in a horizontal direction, and is connected to a plurality of vertical exhaust passages 243b vertically extending in this wall portion of the sidewall 223b. Further, a horizontal exhaust passage 244b extending in a horizontal direction is formed in an upper side of this wall portion, and is connected to the vertical exhaust passages 243b.

The ceiling wall 223a of the cover 223 has a purge gas feed port 245 opened on the upper surface, which is connected to a purge gas supply mechanism 247 through a purge gas line 246. The purge gas feed port 245 is connected to a flow passage 248 formed in the upper plate 232. A purge gas is supplied from the purge gas supply mechanism 247 through the flow passage 248 into a gas feed member 249 located at the center of an upper side of the gas diffusion space d', and is then supplied into the gas diffusion space d' in radial directions from the gas feed member 249. The purge gas thus supplied into the gas diffusion space d' is then delivered from the gas delivery holes 233a of the lower plate 233 into the processing space S'. The purge gas line 246 is provided with a valve 250 for turning on/off the purge gas and adjusting the flow rate thereof.

On the other hand, the loop exhaust passage 241 is connected to exhaust passages 251 extending upward at a plurality of positions, which are connected to exhaust lines 252a above the cover 223. The exhaust lines 252a are connected to a periphery exhaust mechanism 253 through a collecting exhaust line 252b. The collecting exhaust line 252b is provided with a valve 254 for turning on/off exhaust gas and adjusting the flow rate thereof. The interior of the heat processing space S' can be exhausted by the periphery exhaust mechanism 253 from the exhaust ports 238 through the vertical exhaust passages 240 and loop exhaust passage 241 and further through the exhaust lines 252a and collecting exhaust line 252b.

Further, the horizontal gas flow passage 244a is connected to a gas flow passage 255a extending upward, which is connected to a gas supply line 256a above the cover 223. The gas supply line 256a is connected to a gas supply mechanism 257a. The gas supply line 256a is provided with a valve 258a for turning on/off supply gas and adjusting the flow rate thereof. Further, the horizontal exhaust passage 244b is connected to an exhaust passage 255b extending upward, which is connected to an exhaust line 256b above the cover 223. The exhaust line 256b is connected to an exhaust mechanism 257b. The exhaust line 256b is provided with a valve 258b for turning on/off exhaust gas and adjusting the flow rate thereof. A predetermined amount of gas, such as air, is supplied from the gas supply mechanism 257a through the gas flow passage 255a, horizontal gas flow passage 244a, and vertical gas flow passages 243a, and is delivered from the gas delivery port 242a into the heat processing space S'. On the other hand, the interior of the heat processing space S' is exhausted, in accordance with the gas delivery, by the exhaust mechanism 257b through the exhaust port 242b, vertical exhaust passages 243b, horizontal exhaust passage 244b, exhaust passage 255b, and exhaust line 256b. Consequently, unidirectional flows are formed within the heat processing space S'.

Figure 15A:
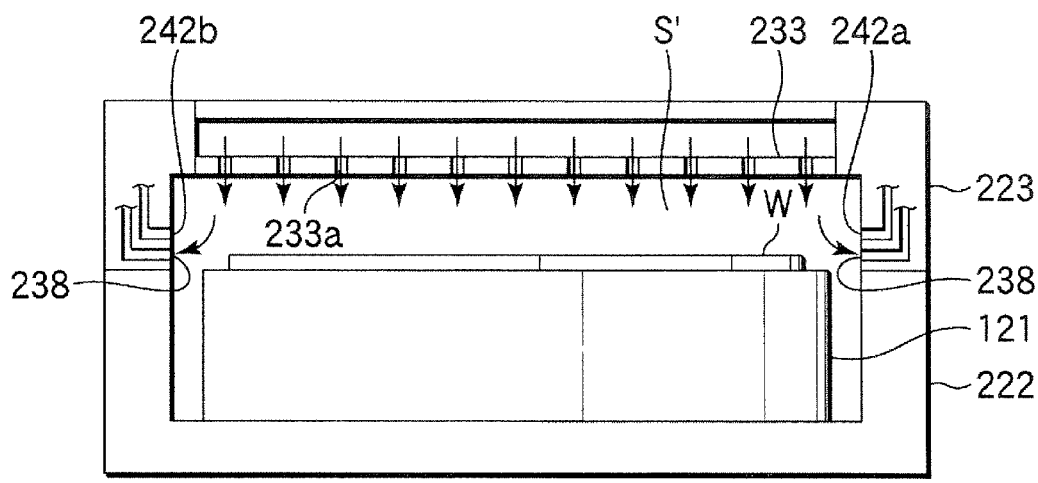
FIGS. 15A and 15B are views schematically showing the heat processing unit according to an alternative embodiment of the present invention, set in a first mode and a second mode, respectively.
Figure 15B:
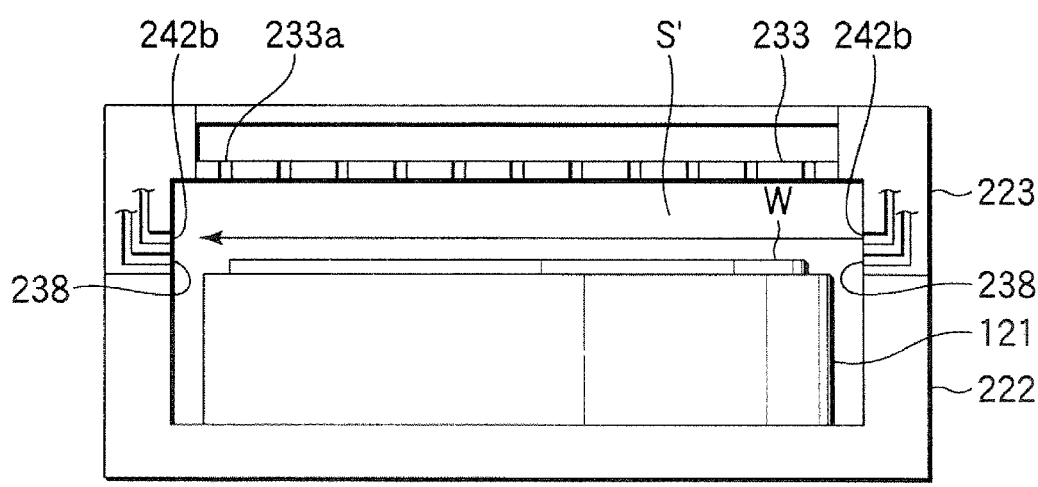

A controller 259 is used for turning on/off and adjusting the valves 250, 254, 258a, and 258b. The controller 259 controls the valves 250, 254, 258a, and 258b in accordance with instructions transmitted from the process controller 101 of the central control section 19 to switch modes between a first mode shown in FIG. 15A and a second mode shown in FIG. 15B. In the first mode, periphery exhaust is set in operation through the exhaust ports 238 while the purge gas is delivered from the gas delivery holes 233a, so that a heat process is performed while downflows are uniformly supplied onto the upper surface of the wafer W. In the second mode, a heat process is performed, while unidirectional flows are formed from the gas delivery port 242a to the exhaust port 242b. In this embodiment, the purge gas supply mechanism 247, periphery exhaust mechanism 253, gas delivery holes 233a, exhaust ports 238, and lines connecting these portions constitute a first gas flow forming mechanism for forming gas flows used in the first mode. On the other hand, the gas supply mechanism 257a, exhaust mechanism 257b, gas delivery port 242a, exhaust port 242b, and the corresponding flow passages and lines constitute a second gas flow forming mechanism for forming gas flows used in the second mode.

Also in this embodiment, as in the previous embodiment, a heat process is first performed in the first mode arranged to give weight to the uniformity in film quality. Then, the heat process is performed in the second mode arranged to give weight to removal of gas and/or sublimed substances generated by the heat process. According to this embodiment, when the heat process is performed in the second mode, unidirectional flows are formed from the gas delivery port 242a to the exhaust port 242b. Consequently, gas and/or sublimed substances generated by the heat process are exhausted and removed along with the unidirectional flows, and thus they are scarcely deposited on the wafer W. Further, the unidirectional flows thus formed can effectively remove gas and/or sublimed substances deposited on the wafer W due to the heat process being performed in the first mode. In the previous embodiment, since the exhaust pipe 135 is located directly above the wafer W, dust derived from gas and/or sublimed substances retained or deposited in the exhaust pipe 135 may drop onto the wafer W. In this respect, according to this embodiment, there is no such a risk. Further, since there is no need to form an exhaust structure on the ceiling wall, the dimension of the heat processing unit in the vertical direction can be decreased.

The present invention is not limited to the embodiments described above, and it may be modified in various manners. For example, in the embodiments described above, a heat process is first performed in a mode arranged to uniformize the quality of a coating film, and then in a mode arranged to remove gas and/or sublimed substances generated from the coating film. However, there is a coating film that tends to generate gas and/or sublimed substances at an early stage. For such case, a heat process may be first performed in a mode arranged to remove gas and/or sublimed substances, and then in a mode arranged to uniformize the film quality. Further, depending on the target substrate, a heat process may be performed only in a mode arranged to uniformize the quality of a coating film, or only in a mode arranged to remove gas and/or sublimed substances generated from a coating film.

In the embodiments described above, the heat processing unit includes a cooling plate. However, as a matter of course, the present invention may be applied to a heat processing unit including no cooling plate.

The present invention may be applied not only to a heat process used in ordinary photolithography, but also to a heat process used in a liquid immersion light exposure process.

In the embodiments described above, the present invention is applied to a heat process performed on a semiconductor wafer with a coating film formed thereon, but this is not limiting. For example, the present invention may be applied to a heat process performed on another substrate, such as a substrate for liquid crystal display devices (LCD), or a heat process performed on a substrate with no coating film formed thereon.

What is claimed is:

1. A heat processing method using a heat process by use of a heat processing apparatus, which comprises a heating plate configured to heat a substrate, a cover configured to surround a space above the heating plate, a first gas flow forming mechanism configured to form first gas flows within the space above the heating plate, and a second gas flow forming mechanism configured to form second gas flows within the space above the heating plate, the method comprising:
placing a target substrate on the heating plate and surrounding the space above the heating plate by the cover; and
then performing a heat process on the target substrate by heating the target substrate by the heating plate,
wherein the heat process is performed along with first and second states of gas flows sequentially set in this order while heating the target substrate by the heating plate,
the first state uses the first gas flow forming mechanism to form, as the first gas flows, downward flows of gas uniformly supplied onto an upper surface of the target substrate to uniformize the heat process over the target substrate, and
the second state uses the second gas flow forming mechanism to form, as the second gas flows, sideward flows of gas along the upper surface of the target substrate by exhausting gas from the space above the heating plate to exhaust and remove at least one of gas and sublimed substances generated from the target substrate.

2. The method according to claim 1, wherein the sideward flows formed in the second state are realized by gas caused to flow from a periphery of the target substrate toward a center thereof and then to be exhausted upward from the center.

3. The method according to claim 1, wherein the sideward flows formed in the second state are realized by gas caused to flow from one side of the target substrate toward an opposite side thereof and then to be exhausted from the opposite side.

4. The method according to claim 2, wherein the downward flows formed in the first state are realized by gas caused to flow from above onto the target substrate and then to be exhausted toward a periphery of the target substrate.

5. The method according to claim 3, wherein the downward flows formed in the first state are realized by gas caused to flow from above onto the target substrate and then to be exhausted toward a periphery of the target substrate.

6. The method according to claim 4, wherein the cover includes a number of gas delivery holes formed in a counter plate facing the heating plate and communicating with a gas diffusion space that pools a purge gas, periphery exhaust ports opened at positions around the heating plate, a center exhaust port opened at a center of the counter plate and connected to an exhaust pipe, and gas intake ports opened at positions around the hating plate, such that the first gas flow forming mechanism forms the downward flows by supplying the purge gas from the gas delivery holes toward the target substrate while exhausting gas on the target substrate from the periphery exhaust ports, and the second gas flow forming mechanism forms the sideward flows by introducing gas from the gas intake ports while exhausting gas on the target substrate from the center exhaust port.

7. The method according to claim 5, wherein the cover includes a number of gas delivery holes formed in a counter plate facing the heating plate and communicating with a gas diffusion space that pools a purge gas, periphery exhaust ports opened at positions around the heating plate, a side delivery port opened at a position on one side around the heating plate, and a side exhaust port opened at a position on an opposite side around the heating plate, such that the first gas flow forming mechanism forms the downward flows by supplying the purge gas from the gas delivery holes toward the target substrate while exhausting gas on the target substrate from the periphery exhaust ports, and the second gas flow forming mechanism forms the sideward flows by supplying gas from the side delivery port toward the target substrate while exhausting gas on the target substrate from the side exhaust port.

8. The method according to claim 1, wherein the target substrate includes a target film formed thereon and consisting of a resist film or an anti-reflective coating for a resist film, and the heat process is performed on the target film.

9. The method according to claim 1, wherein the target substrate includes a target film formed thereon and including a resist film or an anti-reflective coating for a resist film, and the heat processed is performed on the target film.

\* \* \* \* \*